(12) United States Patent
Van Kan et al.

(10) Patent No.: US 11,056,315 B2
(45) Date of Patent: Jul. 6, 2021

(54) IONIZATION CHAMBER CHIP FOR A NANO-APERTURE ION SOURCE, METHOD OF FABRICATION THEREOF, AND A PROTON BEAM WRITING SYSTEM

(71) Applicant: National University of Singapore, Singapore (SG)

(72) Inventors: Jeroen Anton Van Kan, Singapore (SG); Xinxin Xu, Singapore (SG); Santhana Ramam Pattabiraman, Singapore (SG); Rudy Pang, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 16/634,011

(22) PCT Filed: Jul. 27, 2018

(86) PCT No.: PCT/SG2018/050378
§ 371 (c)(1),
(2) Date: Jan. 24, 2020

(87) PCT Pub. No.: WO2019/022672
PCT Pub. Date: Jan. 31, 2019

(65) Prior Publication Data
US 2020/0211822 A1    Jul. 2, 2020

(30) Foreign Application Priority Data
Jul. 28, 2017   (SG) .............................. 10201706169T

(51) Int. Cl.
*H01J 37/31*   (2006.01)
*H01J 9/02*    (2006.01)
(Continued)

(52) U.S. Cl.
CPC ............ *H01J 37/3174* (2013.01); *H01J 9/02* (2013.01); *H01J 37/08* (2013.01);
(Continued)

(58) Field of Classification Search
CPC .......... H01J 37/3174; H01J 9/02; H01J 37/08; H01J 2237/0453; H01J 2237/062;
(Continued)

(56) References Cited

U.S. PATENT DOCUMENTS 4,902,897 A   2/1990  Iwamatsu
6,924,493 B1  8/2005  Leung
(Continued)

FOREIGN PATENT DOCUMENTS

CN        104049467 A     9/2014

OTHER PUBLICATIONS

Jun, "Development of the Nano-Aperture Ion Source (NAIS)", PhD Thesis, Nov. 6, 2014.*
(Continued)

*Primary Examiner* — Nicole M Ippolito
(74) *Attorney, Agent, or Firm* — Michael Best & Friedrich LLP

(57) ABSTRACT

An ionization chamber chip, a nano-aperture ion source, a proton beam writing system, and a method of fabricating an ionization chamber chip. The method comprises the step of providing a first substrate comprising a first depression formed in a back surface thereof; providing a backing element attached at the back surface of the first substrate such that a chamber is formed comprising at least the first depression; forming a gas inlet in the first substrate in fluid communication with the chamber; and forming a first aperture structure in the first substrate in fluid communication with the chamber.

20 Claims, 12 Drawing Sheets

Figure 1:
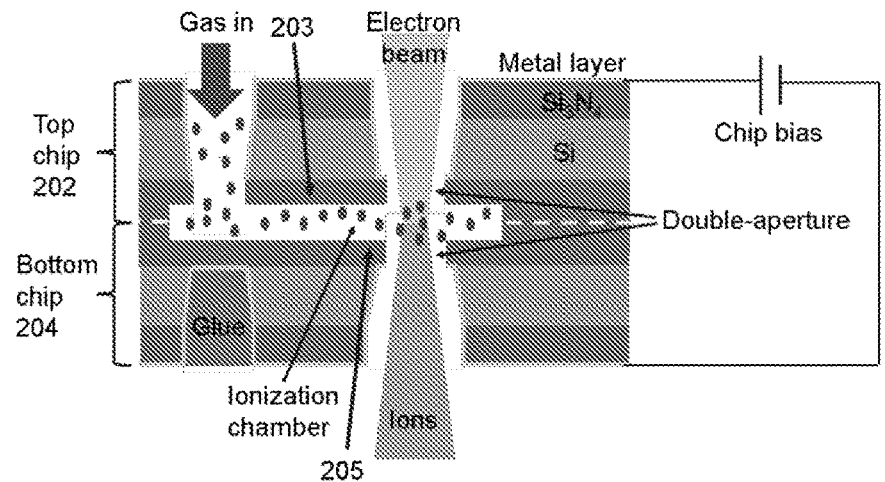

(51) Int. Cl.
H01J 37/08 (2006.01)
H01J 37/317 (2006.01)
(52) U.S. Cl.
CPC . *H01J 2237/0453* (2013.01); *H01J 2237/062* (2013.01); *H01J 2237/082* (2013.01); *H01J 2237/31737* (2013.01)
(58) Field of Classification Search
CPC ....... H01J 2237/082; H01J 2237/31737; H01J 37/317; H01J 27/02; H01J 27/20
USPC .............................................. 250/423 R, 424
See application file for complete search history.

(56) References Cited

U.S. PATENT DOCUMENTS

| | | |
|---|---|---|
| 8,648,315 B1 | 2/2014 | Hailey et al. |
| 2014/0001372 A1 | 1/2014 | Schwind et al. |
| 2015/0293450 A1 | 10/2015 | Breese et al. |

OTHER PUBLICATIONS

J.A. van Kan, A.A. Bettiol, F. Watt, Proton beam writing of three-dimensional nano-structures in hydrogen silsesquioxane, Nano Lett. 6 (3) (2006) 579-582.
F.Watt, M.B.Breese, A.A.Bettiol, J.A.vanKan, Protonbeamwriting, Mater.Today 10 (6) (2007) 20-29.
J.A. Van Kan, A.A.Bettiol, F. Watt, Three-dimensional nanolithography using proton beam writing, Appl. Phys. Lett. 83 (8) (2003) 1629-1631.
C. Udalagama, A.A. Bettiol, F. Watt, Stochastic spatial energy deposition profiles for MeV protons and keV electrons, Phys. Rev. B 80 (22) (2009) 224107.
J.A.VanKan, P.Shao, K.Ansari, A.A.Bettiol, T.Osipowicz, F.Watt, Proton beam writing: a tool for high-aspect ratio mask production, Microsyst. Technol. 13 (5-6) (2007) 431-434.
R. Szymanski, D.N. Jamieson, Ion source brightness and nuclear microprobe applications, Nucl. Instrum. Methods Phys. Res., Sect. B 130 (1) (1997) 80-85.
J.A. Van Kan, P. Malar, A.B. De Vera, The second generation Singapore high resolution proton beam writing facility, Rev. Sci. Instrum. 83 (2) (2012) 026902.
M. Reiser, Theory and Design of Charged Particle Beams, John Wiley & Sons, 2008.
J. Orloff, Handbook of Charged Particle Optics, CRC press, 2008. Chapter 3, pp. 87-128 and 341-390.
J. Orloff, High-resolution focused ion beams, Rev. Sci. Instrum. 64 (5) (1993) 1105-1130.
J. Orloff, L.Swanson, M.Utlaut, High Resolution Focused Ion Beams: FIB and Its Applications: the Physics of Liquid Metal Ion Sources and Ion Optics and their Application to Focused Ion Beam Technology, Springer Science & Business Media, 2003.
P.D. Prewett, G.L.R. Mair, Focused Ion Beams from Liquid Metal Ion Sources, Research Studies Press Ltd, 1991.
R. Forbest, Understanding how the liquid-metal ion source works, Vacuum 48 (1) (1997) 85-97.
G. Taylor, Disintegration of water drops in an electric field, Proc. R. Soc. Lond. A (1964) 383-397.
M. Watts, Analytical model of positive resist development applied to line width control in optical lithography, J. Vac. Sci. Technol. B 3 (1) (1985) 434-440.
C. Hagen, E. Fokkema, P. Kruit, Brightness measurements of a gallium liquid metal ion source, J. Vac. Sci. Technol. B 26 (6) (2008) 2091-2096.
N.P. Economou, J.A. Notte, W.B. Thompson, The history and development of the helium ion microscope, Scanning 34 (2) (2012) 83-89.
G. Hlawacek, V. Veligura, R. van Gastel, B. Poelsema, Helium ion microscopy, J. Vac. Sci. Technol. B 32 (2) (2014) 020801.
B. Ward, J.A. Notte, N. Economou, Helium ion microscope: a new tool for nanoscale microscopy and metrology, J. Vac. Sci. Technol. B 24 (6) (2006) 2871-2874.
F. Rahman, S. McVey, L. Farkas, J.A. Notte, S. Tan, R.H. Livengood, The prospects of a subnanometer focused neon ion beam, Scanning 34 (2) (2012) 129-134.
R. Hill, J. J Notte, B. Ward, The ALIS He ion source and its application to high resolution microscopy, Phys. Procedia 1 (1) (2008) 135-141.
H.-S. Kuo, S. Hwang, T.-Y. Fu, Y.- H. Lu, C.-Y. Lin, T.T. Tsang, Gas field ion source from an Ir/W b111N single-atom tip, Appl. Phys. Lett 92 (2008) 063106.
N.G. Einspruch, S.S. Cohen, R.N. Singh, Beam Processing Technologies, Academic Press, 2014.
J.J. McClelland, A.V. Steele, B. Knuffman, K.A. Twedt, A. Schwarzkopf, T.M. Wilson, Bright focused ion beam sources based on laser-cooled atoms, Appl. Phys. Rev. 3 (1) (2016) 011302.
B. Knuffman, A. Steele, J. McClelland, Cold atomic beam ion source for focused ion beam applications, J. Appl. Phys. 114 (4) (2013) 044303.
S. Van der Geer, M. Reijnders, M. de Loos, E. Vredenbregt, P. Mutsaers, O. Luiten, Simulated performance of an ultracold ion source, J. Appl. Phys. 102 (9) (2007) 094312.
J.L. Hanssen, J.J. Mc Clelland, E. Dakin, M. Jacka, Laser-cooled atoms as a focused ion-beam source, Phys. Rev. A 74 (6) (2006) 063416.
J.L. Hanssen, S.B. Hill, J. Orloff, J.J. McClelland, Magneto-optical-trap-based, high brightness ion source for use as a nanoscale probe, Nano Lett. 8 (9) (2008) 2844-2850.
K.A. Twedt, L. Chen, J.J. McClelland, Scanning ion microscopy with low energy lithium ions, Ultramicroscopy 142 (2014) 24-31.
D.S. Jun, V.G. Kutchoukov, P. Kruit, Ion beams in SEM: an experiment towards a high brightness low energy spread electron impact gas source, J. Vac. S. Technol. B 29 (6) (2011) 06F603.
X. Xu, N. Liu, P.S. Raman, S. Qureshi, R. Pang, A. Khursheed, J.A. van Kan, Design considerations for a compact proton beam writing system aiming for fast sub-10 nm direct write lithography, Nucl. Instrum. Methods Phys. Res., Sect. B (2016) http://dx. doi.org/10.1016/j.nimb.2016.12.031 (in press).
N. Liu, X. Xu, R. Pang, P.S. Raman, A. Khursheed, J.A. van Kan, Brightness measurement of an electron impact gas ion source for proton beam writing applications, Rev. Sci. Instrum. 87 (2) (2016) 02A903.
N. Liu, P.S. Raman, X. Xu, H.M. Tan, A. Khursheed, J.A. van Kan, Development of ion sources: towards high brightness for proton beam writing applications, Nucl. Instrum. Methods Phys. Res., Sect. B 348 (2015) 23-28.
R. Rejoub, B. Lindsay, R. Stebbings, Determination of the absolute partial and total cross sections for electron-impact ionization of the rare gases, Phys. Rev. A 65 (4) (2002) 042713.
D.W. Heddle, Electrostatic Lens Systems, Chapter 5, pp. 80-104, CRC Press, 2000.
AccelSoft Inc. Particle Beam Optics Laboratory 3.0 (PBO Lab). <http://www.ghga.com/accelsoft/pbolab.html>, publicly available at least as early as Jul. 23, 2001.
F. Watt, G.W. Grime, Principles and Applications of High-Energy Ion Microbeams, Chapter 5, pp. 80-104, 1987.
G.W. Grime, F. Watt, Beam Optics of Quadrupole Probe-Forming Systems, Hilger, Chapter 1, pp. 18-33, 1984.
J. Barth, P. Kruit, Addition of different contributions to the charged particle probe size, Optik 101 (1996) 101-109.
Jun, "Development of the Nano-Aperture Ion Source (NAIS)," Portland State University, 2014.
Nannan, "Development of an Electron Impact Gas Ion Source for Proton Beam Writing Applications," Dept. of Electrical & Computer Engineering, National University of Singapore, 2015.
Xinxin, "Development and Optimization of High Brightness Nano-Aperture Ion Source for Proton Beam Writing Applications," Dept. of Physics, National University of Singapore, 2017.
Jun et al., "Design and fabrication of a miniaturized gas ionization chamber for production of high quality ion beams," Microelectronic Engineering 97 (2012) 134-137.

(56) References Cited

OTHER PUBLICATIONS

Jun et al., "Ion beams in SEM: An experiment towards a high brightness low energy spread electron impact gas ion source," Journal of Vacuum Science & Technology B29, 06F603 (2011).
Sarkar et al., "Proton beam writing for minimum step lithography in multilayer patterning," 16th International Workshop on Physics of Semiconductor Devices, Proc. of SPIE vol. 8549, 854912 (2012).
Rout et al., "Maskless micromachining with high-energy focused ion beams," Emerging Lithographic Technologies IX, Proceedings of SPIE vol. 5751, pp. 1050-1057 (2005).
Schulte-Borchers et al., "3D microstructuring in p-GaAs with proton beam writing using multiple ion fluences," J. Micromech. Microeng. 22 (2012) 025011 (6pp).
International Search Report and Written Opinion for Application No. PCT/SG2018/050378 dated Oct. 1, 2018 (11 pages).
International Preliminary Report on Patentability for Application No. PCT/SG2018/050378 dated Feb. 6, 2020 (9 pages).
J. Orloff, Handbook of Charged Particle Optics, CRC press, 2008., Chapter 7, pp. 341-390.

\* cited by examiner

IONIZATION CHAMBER CHIP FOR A NANO-APERTURE ION SOURCE, METHOD OF FABRICATION THEREOF, AND A PROTON BEAM WRITING SYSTEM

CROSS REFERENCE TO RELATED APPLICATIONS

This application is a national stage filing under 35 U.S.C. § 371 of International Patent Application No.: PCT/SG2018/050378, filed Jul. 27, 2018, which claims priority to Singapore Patent Application No. 10201706169T, filed Jul. 28, 2017, the entire contents of all of which are hereby incorporated by reference herein.

TECHNICAL FIELD

This invention relates broadly to an ionization chamber chip, a nano-aperture ion source, to a proton beam writing (c-PBW) system, in particular to a compact c-PBW system, and to a method of fabricating an ionization chamber chip.

BACKGROUND

Any mention and/or discussion of prior art throughout the specification should not be considered, in any way, as an admission that this prior art is well known or forms part of common general knowledge in the field.

Proton beam writing (PBW) is a direct-write lithographic technique developed in the Centre for Ion Beam Applications, National University of Singapore (CIBA-NUS), which employs focused protons, for fabricating three-dimensional nano-structures [1-3]. Compared with electron beam lithography (EBL), the advantage of PBW is that a proton is ~1800 times heavier than an electron, which makes a proton transferring less energy to secondary electrons and thus penetrating further into the material, depositing a constant energy along its path in the resist [4]. With these unique features, PBW can fabricate nano-structures without proximity effects, and having smooth sidewalls [3, 5]. Currently, the performance of PBW in terms of spot size and throughput is limited by low brightness ~20 A/(m$^2$srV) of the radio frequency (RF) ion source, available in current PBW systems [6, 7]. Therefore, a high brightness ion source is desirable to further improve the performance of PBW systems.

The reduced brightness is an important parameter to exemplify beam quality, like beam current density, beam angular spread, and beam energy spread [8, 9]. Reducing the virtual source size is a practical way to obtain a high brightness ion source [10]. High brightness ion sources, like liquid metal ion source (LMIS) and gas field ionization source (GFIS), have small virtual source sizes. LMIS is the most widely used high brightness ion source, which has a liquid metal reservoir on top of a sharp tip [11-13]. A strong electric field is used to pull the liquid metal to a sharp electrospray cone, known as Taylor cone [14].

Meanwhile this strong electric field also generates ions at the tip of the Taylor cone by field evaporation. The most often used LMIS is Ga-LMIS but several other metals (e.g. Al, In, Sn, Cs, Bi, Au) as well as alloy metals (Au—Si, Au—Ge, Si—Be—Au, Ni—B—Pt) are also used [11]. The typical virtual source size of Ga-LMIS is about 50 nm and the reduced brightness is about 10$^6$ A/(m$^2$srV) with typical energy spread of around 5 eV [11, 15, 16]. However, the choice of ions from the LMIS is limited to metallic ions, and the energy spread results in high chromatic aberration. GFIS has recently emerged as a possible choice for high brightness ion source, which is based on the field ionization created by strong electric field [17-19]. A strong electric field is concentrated at the apex of a pyramidal tip, which terminates with three atoms. GFIS has been mostly used for generating He and Ne ions [19, 20]. For He-GFIS, the reduced brightness can reach as high as 10$^9$ A/(m$^2$srV) with a 1 eV energy spread [21]. The small virtual source size (<1 nm), due to the three-atom terminated tip, results in having high brightness [22, 23]. While the GFIS can deliver an extremely high brightness ion beam, it is limited by the variety of available ion species. Another approach to obtain a high brightness ion source is to reduce the beam angular spread, which can be achieved by reducing the source operating temperature (<100 μK). Such ion sources, operating at low temperatures (usually achieved by laser cooling), are called cold atom ion sources. These ion sources have a theoretical reduced brightness of around 10$^7$ A/(m$^2$srV), with <0.5 eV energy spread [24-27]. Using laser-cooled Cr atoms and Li atoms, beams with reduced brightness of 2.25×10$^4$ A/(m$^2$srV) [28] and 6×10$^3$ A/(m$^2$srV) [29] have been achieved, respectively. Although these ion sources can deliver high brightness ion beams, they are not designed to produce high brightness proton beams. A nano-aperture ion source (NAIS) with an estimated brightness of 10$^6$ A/(m$^2$srV) has been reported by the Charged Particle Optics group at Delft University of Technology [30]. This NAIS is expected to generate high brightness proton beams. Thus NAIS is a prospective candidate for a sub-10 nm PBW system, which can deliver high throughput. This system is expected to achieve writing speed comparable to those in EBL without the unwanted proximity effect [31].

Embodiments of the present invention seek to address one or more of the above-mentioned needs.

SUMMARY

In accordance with a first aspect an ionization chamber chip for a nano-aperture ion source is provided, the ionization chamber chip comprising:
a first substrate comprising a first depression formed in a back surface thereof;
a backing element attached at the back surface of the first substrate such that a chamber is formed comprising at least the first depression;
a gas inlet formed in the first substrate in fluid communication with the chamber; and
a first aperture structure formed in the first substrate in fluid communication with the chamber.

In accordance with a second aspect a nano-aperture ion source is provided comprising the ionization chamber chip of the first aspect.

In accordance with a third aspect proton beam writing system is provided comprising the nano-aperture ion source of the second aspect.

In accordance with a fourth aspect a method of fabricating an ionization chamber chip for a nano-aperture ion source is provided, the method comprising:
providing a first substrate comprising a first depression formed in a back surface thereof;
providing a backing element attached at the back surface of the first substrate such that a chamber is formed comprising at least the first depression;
forming a gas inlet in the first substrate in fluid communication with the chamber; and forming a first aperture structure in the first substrate in fluid communication with the chamber.

DETAILED DESCRIPTION

The mechanism of NAIS is to extract ions from electron-gas collision, which creates ionization, in a sub-micron ionization chamber. This is a simple and reliable ionization approach to generate various types of ions. The superiority of NAIS is to reduce the virtual source size to sub-micrometer while maintaining a strong electric field (~$10^7$ V/m) with a small chip bias (~1 V), resulting in an ion energy spread of 1 eV [30]. Furthermore, the versatility of NAIS makes it convenient to select different ion species spanning from low Z to heavy Z gaseous elements, catering to different applications. The inventors have recognized that these virtues critically depend on the ionization chamber to deliver high brightness ions. The inventors found that the ion brightness of existing NAIS was critically limited by large dimension (600 nm height) of the ionization chamber, thick silicon nitride membranes (1 μm), and a large double-aperture (1.5 μm) [32, 33]. Therefore, a modified ionization chamber is fabricated according to example embodiments of the present invention described herein to further improve the performance of NAIS.

Figure 2:
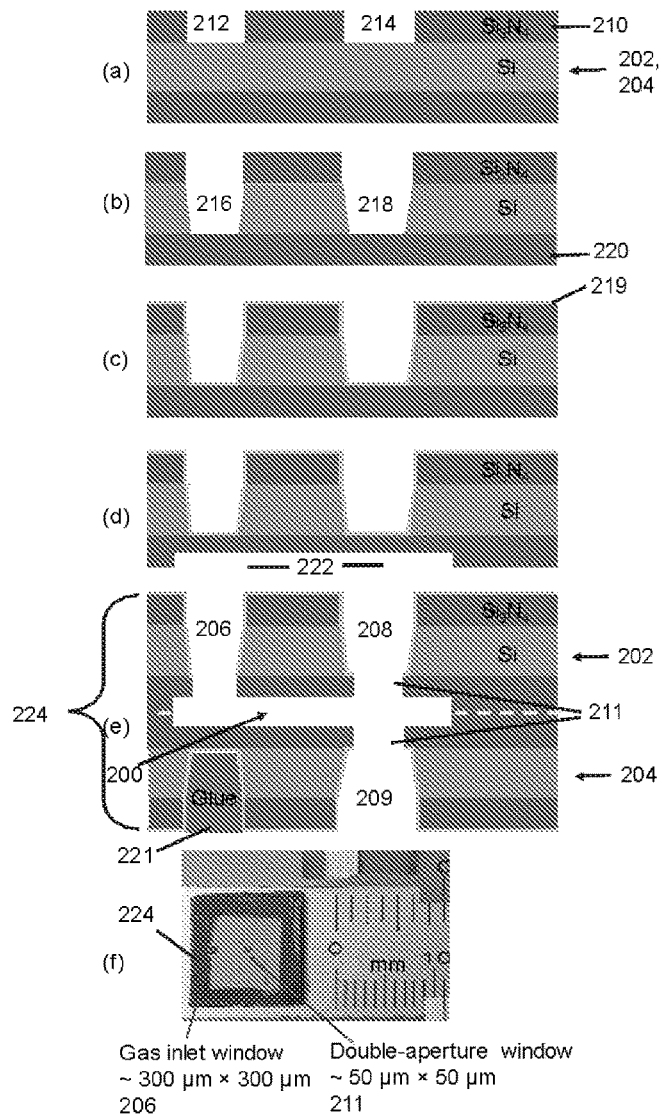

In one non-limiting example embodiment, an approximately or exactly 7 mm×1 mm×300 nm NAIS ionization chamber is fabricated by bonding, in an example embodiment by gluing, two chips 202, 204 with respective silicon nitride membranes 203, 205, as shown in FIG. 1. A microelectromechanical system (MEMS) technique may be used in the example embodiment. The step-by-step fabrication procedure according to a non-limiting example embodiment is schematically shown in FIG. 2. As illustrated in step (e), the ionization chamber 200 is formed from top and bottom chips 202, 204 of an approximately or exactly 400 μm thick <100> silicon wafer, respectively. The silicon wafer was double-side-polished with an approximately or exactly 280 nm low-pressure chemical vapor deposited (LPCVD) silicon nitride on both sides, according to an example embodiment. To advantageously enable batch production, the top and bottom chips 202, 204 are designed to be identical to each other, according to an example embodiment. In order to create the gas inlet 206, electron beam inlet 208 window, and ion beam outlet 209 window (inlet 208 window and outlet 209 window jointly also referred to as double-aperture 211 hereinafter), the front side of each wafer 202, 204 is spin-coated in an example embodiment with approximately or exactly 2.5 μm thick AZ 1518 photoresist (not shown), followed by an approximately or exactly 50 s soft bake at 100° C. Subsequently, the photoresist is exposed in an example embodiment with an approximately or exactly 405 nm laser to pattern mask regions for the windows. The photoresist with the exposed mask regions is developed in AZ 400k developer diluted to 1:4 with DI water for approximately or exactly 1 min in an example embodiment. The patterned opening for the windows are then transferred to the silicon nitride layer 210 of the top and bottom chips 202, 204 forming openings 212, 214, in an example embodiment through deep reactive ion etching (DRIE) with process parameters of approximately or exactly 48 sccm $CHF_3$, approximately or exactly 5 sccm $O_2$, approximately or exactly 15 Pa pressure, and approximately or exactly 250 W RF power, as shown in step (a). This is followed by stripping of the residual AZ 1518 resist in acetone, opening up access holes 216, 218 by etching the exposed Si in KOH in an example embodiment (step (b)) creating a freestanding silicon nitride membrane 220, and electrode formation by depositing a conductive layer 219 (in an example embodiment approximately or exactly 10 nm Cr and 20 nm Au) via magnetron sputtering in an example embodiment on the side of the wafers 202, 204 where the openings 212, 214 and access holes 216, 218 are formed (step (c)), hereinafter referred to as the front side for ease of reference. On completing the process steps at the front side of the wafers 202, 204, a fabrication process is carried out at the back side of the wafers 202, 204 (i.e. the side opposite to the side of the wafers 202, 204 where the openings 212, 214 and access holes 216, 218 are formed) to create the ionization chamber 200. For the back side, in an example embodiment the wafers 202, 204 are spin-coated with approximately or exactly 5 m thick AR-P 3250 photoresist followed by approximately or exactly 2 min soft bake at approximately or exactly 95° C. The ionization channel pattern is exposed in an example embodiment using an approximately 365 nm ultraviolet (UV) and developed in an example embodiment in AR 300-26 developer diluted to approximately or exactly 3:2 in DI water for approximately or exactly 1.5 min. The back side of the wafers 202, 204, i.e. the silicon nitride membrane 220 in an example embodiment is dry-etched down to approximately or exactly 150 nm depth in a selected window 222 (see step (d)). The two chips 202, 204 are then bonded back face to back face to form the overall NAIS chip 224 (see step (e)) to create an ionization chamber with, in an example embodiment, a dimension of approximately or exactly 7 mm×1 mm×300 nm. In an example embodiment the gas inlet aperture 206 and the double-aperture 211 (i.e. the electron inlet 208 window and the ion beam outlet 209 window) are created with the aid of gallium FIB milling (FEI Quanta Dual Beam). The double-aperture 211 size in an example embodiment is set to be approximately or exactly 500 nm. The opening 221 at the side of the NAIS chip 224 on which, in use, the ion beam exits the ionization chamber 200, hereinafter referred to as the bottom side of the NAIS chip 224, is sealed off in an example embodiment using vacuum glue for retaining better gas pressure within the ionization chamber 200. Step (f) shows a photograph of a fabricated NAIS chip 224 with an approximately or exactly 300 μm×300 μm gas inlet aperture 206 and 50 μm×50 μm double-aperture 211.

From an experimental standpoint, the reduced brightness is defined as [34, 35]

$$B_r = \frac{I_a}{A_s \Omega V} = \frac{I_a}{A_s \frac{A_a}{L^2} V} \quad (1)$$

where $I_a$ is the ion beam current, $A_s$ is the virtual source area, $\Omega$ is the solid angle which defines the beam divergence, V is the beam acceleration potential, $A_a$ is the angular aperture area, and L is the distance between virtual source and the angular aperture.

Figure 3:
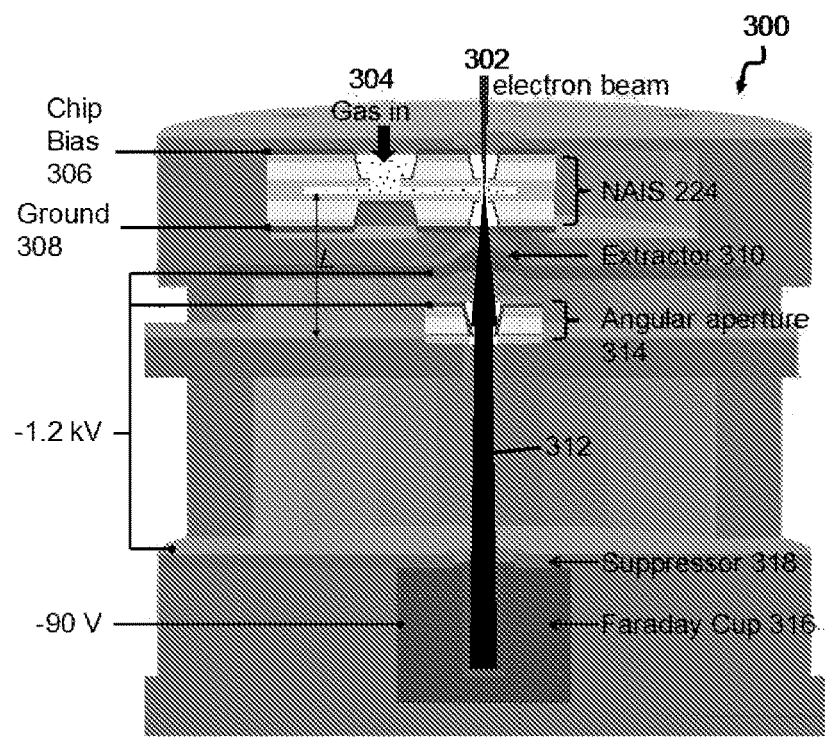

To set up the reduced brightness measurement, a JEOL JSM-5600 tungsten scanning electron microscopy (SEM) is used as an electron injector in an example embodiment. This SEM is operated at approximately or exactly 1 keV with an electron beam current of a few tens of nA. The brightness measurement setup 300 is positioned inside the SEM chamber (not shown), as shown in FIG. 3. Focused electrons 302 are injected into the NAIS chip 224 through the double-aperture 211 (compare FIG. 2) to ionize the gas 304. A regulator valve (not shown) is used in an example embodiment to control inlet gas pressure between approximately or exactly 1 mbar and 1 bar. The reduced brightness measurement is performed with argon ions in an example embodiment ($Ar^+$ approximately or exactly 95%, the rest are $Ar_n^+$, n=2 to 4) [36] to examine the performance of the NAIS chip 224 according to a non-limiting example embodiment. The electric field, across the chip bias electrode 306 and the ground electrode 308, inside the ionization chamber 200 (compare FIG. 2) is varied by tuning the bias across the NAIS chip 224 from approximately or exactly 0 to 100 V in an example embodiment. The extractor 310 is set at a negative potential (<−1 kV) to accelerate the ion beam 312 and also to advantageously prevent the injected electron beam 302 from travelling further downstream into the setup 300 in an example embodiment. For the purpose of measuring the brightness of the ion source, i.e. the performance of the source, an angular aperture 314 (approximately or exactly 95 μm×112 μm, 10 mm downstream from the NAIS chip 224 in an example embodiment) to define the solid angle is kept at the same potential as the extractor 310 in an example embodiment. The angular aperture 314 is fabricated by a similar process as described above with reference to FIG. 2 for the NAIS chip's 224 double aperture 211 (compare FIG. 2) in an example embodiment. This angular aperture 314 (maintained at equipotential with the extractor 310 in an example embodiment) is mounted on a piezo-XY linear stage (SmarAct® SLC-1720-S-HV) in an example embodiment and scanned through the ion beam to find the peak axial beam current as measured in a Faraday cup 316. Downstream of the angular aperture 314, a suppressor electrode 318 (at equipotential with the extractor 310 in an example embodiment) is used to maintain a preferably field-free region for ions. The Faraday cup 316 is biased at approximately or exactly −90 V in an example embodiment to advantageously aid ion beam-landing.

It was previously reported that increasing the inlet gas pressure in NAIS results in generating a higher ion beam current [33]. Accordingly, in the current experiment the inlet Ar gas pressure is set to be approximately or exactly 860 mbar in an example embodiment. The Knudsen number $K_n$, which is defined as the ratio of the molecular mean free path length to the ionization chamber height, under those conditions is around 0.2. Further increase in the inlet gas pressure may lead to undesired ion-gas collisions. Chip bias is used to repel ions out of NAIS chip 224 in an example embodiment. This chip bias is varied from approximately or exactly 0 to 100 V to obtain maximum output current from the NAIS chip 224. In the NAIS's chip 224 mechanical design in an example embodiment, a misalignment of about 100 μm is inherited between the double-aperture 211 (compare FIG. 2) and the extractor 310, resulting in off-axis aberration. This can cause a negative influence on the reduced brightness measurement, especially for high extraction potential [37]. Therefore, the extractor 310 potential is deemed to be optimal at −1.2 kV in an example embodiment. With the following parameters: inlet gas pressure of approximately or exactly 860 mbar, chip bias of approximately or exactly 23 V, and an extractor 310 potential of approximately or exactly −1.2 kV, an axial peak current of about 230 pA is observed in an example embodiment. It is noted that the chip bias can advantageously be reduced in preferred embodiments of the present invention as will be described below with reference to FIGS. 4 to 10. On substituting these values in Eq. (1), a reduced brightness for $Ar^+$ is found to be about $9.1 \times 10^3$ A/($m^2$srV). Here, the value of virtual source size is considered to be the same as the double-aperture size (approximately or exactly 500 nm). Since the virtual source size of a planar emitter is expected to be smaller than the real source size [32], the actual reduced brightness in an example embodiment can be expected to be much higher.

The injected electron beam 302, used to ionize Ar gas molecules in an example embodiment, has a relatively larger spot size with respect to the double-aperture 211 (compare FIG. 2). This can induce clogging on the surface of the NAIS chip 224 at the entrance of double-aperture 211 (compare FIG. 2), due to electron beam-induced deposition (EBID). To preferably prevent this clogging effect, a fine focused electron beam is used in preferred example embodiments.

As recognized by the inventors, the ionization chamber 200 (compare FIG. 2) is critical to achieve a high brightness ion beam. To improve the performance of the reported prototype NAIS [32, 33], a modified NAIS chip 224 is fabricated and tested in example embodiments described herein. The modified NAIS chip 224 has an integral ionization chamber 200 inside silicon nitride membranes 220. The double-aperture 211 (compare FIG. 2) of the NAIS chip 224 is reduced to approximately or exactly 500 nm in diameter in an example embodiment. The fabrication process according to an example embodiment is advantageously designed for batch production using MEMS fabrication techniques. With the modified NAIS chip 224, a reduced brightness of about $9.1 \times 10^3$ A/($m^2$srV) of $Ar^+$ has been achieved in an example embodiment, which is one (1) order higher than the reported prototype NAIS [32, 33] and three (3) orders higher than the RF source in the existing PBW system [7]. Better mechanical alignment of the NAIS chip 224 and extractor 310, higher electron beam 302 current density, determination of more appropriate virtual source size, and fine tuning of other parameters can be reasonably expected to result in further enhanced reduced brightness according to further example embodiments of the present invention.

According to Equation (1), injected electrons of 1 keV can produce a proton beam with a reduced brightness of about $10^6$ A/($m^2$srV) with about 500 pA current through an 60 nm virtual source size according to a non-limiting example embodiment.

Embodiments of the present invention are preferably capable of creating an approximately or exactly 50-200 nm high ionization chamber with small (<10 nm) deformation for NAIS with high brightness and low energy spread. In preferred embodiments, supporting beams/grids adhered to the wall of the ionization chamber can facilitate this advantage. In the following, two such preferred embodiments will be described by way of example only. In one of these embodiments, the NAIS chip comprises two bonded chips, while in the other embodiment the NAIS chip has a ~10-100 nm thick graphite layer to seal the ionization chamber.

Figure 4:
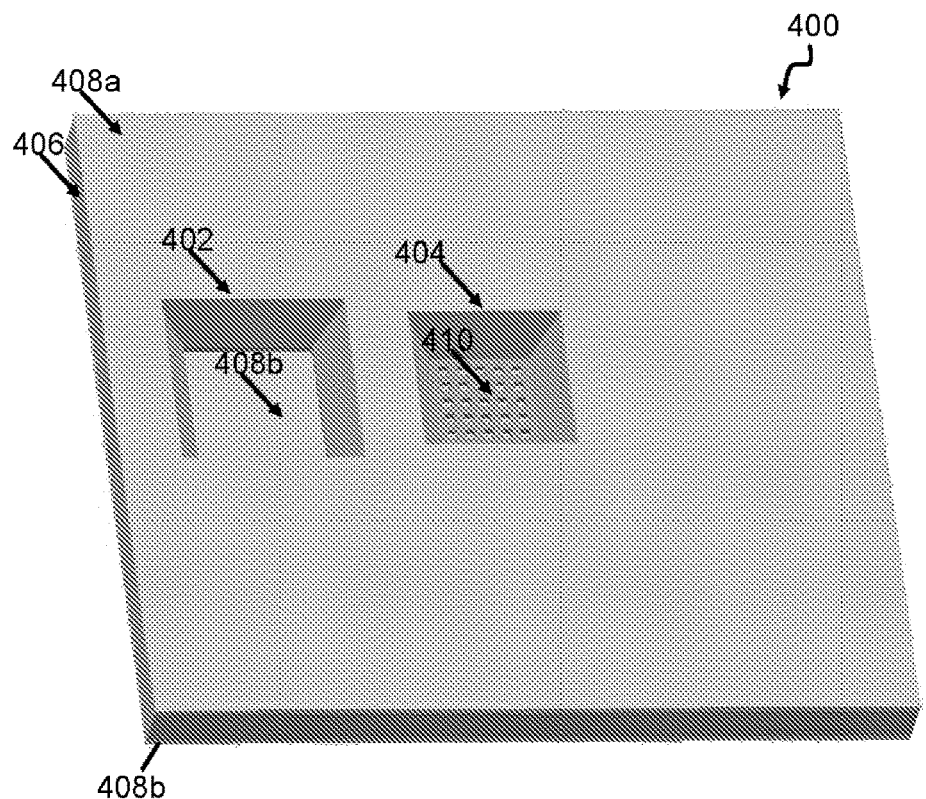
Figure 5:
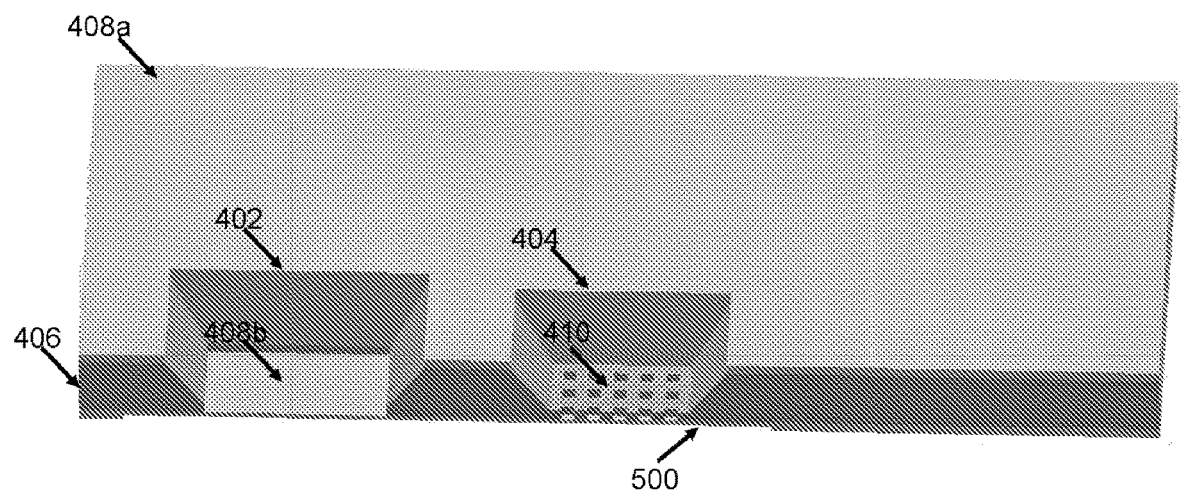

FIG. 4 shows the chip 400 which can be integrated as NAIS according to one embodiment. The gas inlet window 402 and electron injected/ion extracted window 404 are formed in a <100> silicon wafer 406 with an approximately or exactly 50-500 nm nanometer double side coated silicon nitride 408a, b. The bottom side silicon nitride 408b serves as the ionization chamber wall to constrain the gas and holds the pressure difference between gas (~1 bar) and vacuum. The top side silicon nitride 408a acts as a mask for desired patterning followed by DRIE. The pyramid shape of the windows 402, 404 in the silicon 406 can be formed in the potassium hydroxide (KOH) solution and accurately controlling the etching depth for approximately or exactly 15 μm thick residual silicon. The residual silicon is milled by focused ion beam (FIB), or FIB followed by KOH etching, or lithographic patterning followed by DRIE etching, to create supporting beams/grids 410. Because the silicon nitride 408b is very thin, it is desirably that the milling process stops before reaching the silicon nitride 408b membrane, with thin µm protective silicon layer left. This protective silicon layer 406 can be removed by DRIE with a suitable recipe or by KOH etching, as understood in the art. As shown in FIG. 5, the supporting beams/grids 410 are orthogonally distributed with approximately or exactly 10 µm spacing arrangement in a non-limiting example embodiment.

Figure 6:
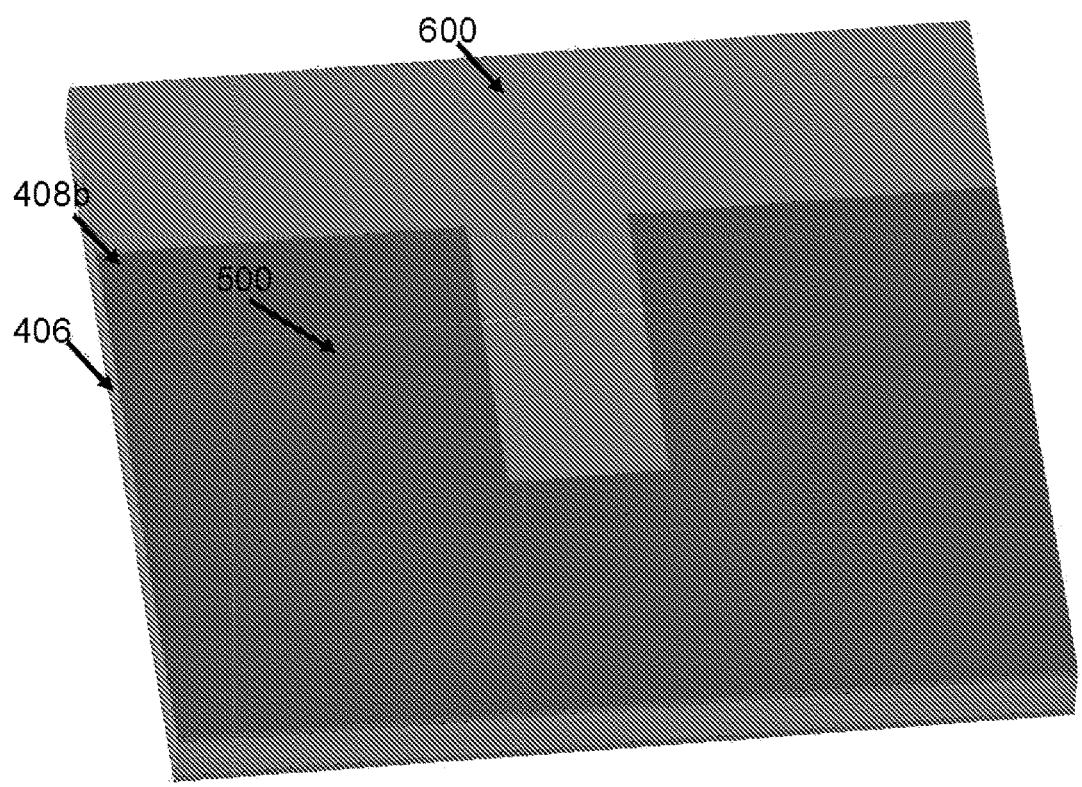

Next, the fabrication process is carried out at the back side of the wafer 406 to create the ionization chamber 500. The ionization chamber 500 is created by RIE for approximately or exactly 50-200 nm depth in the example embodiment, followed by approximately or exactly 10 nm gold 600 deposition to create the electrodes, as shown in FIG. 6. An approximately or exactly 10 nm chromium serves as an adhesion layer between gold and silicon nitride 408b. Electrodes are chosen to have no-contact to each other when bonding two chips together, as will be described below.

Figure 7:
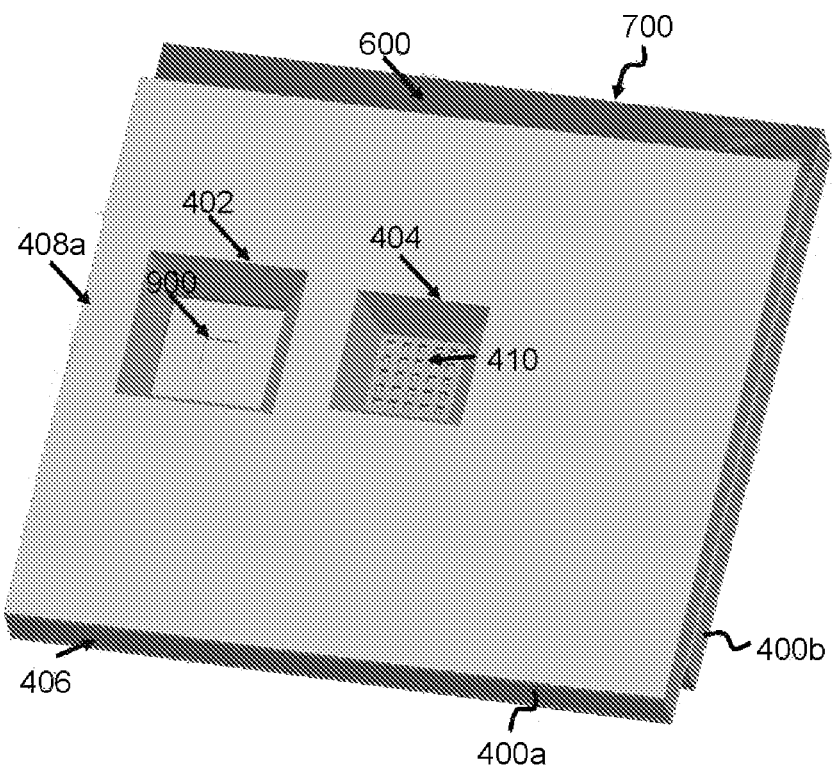
Figure 8:
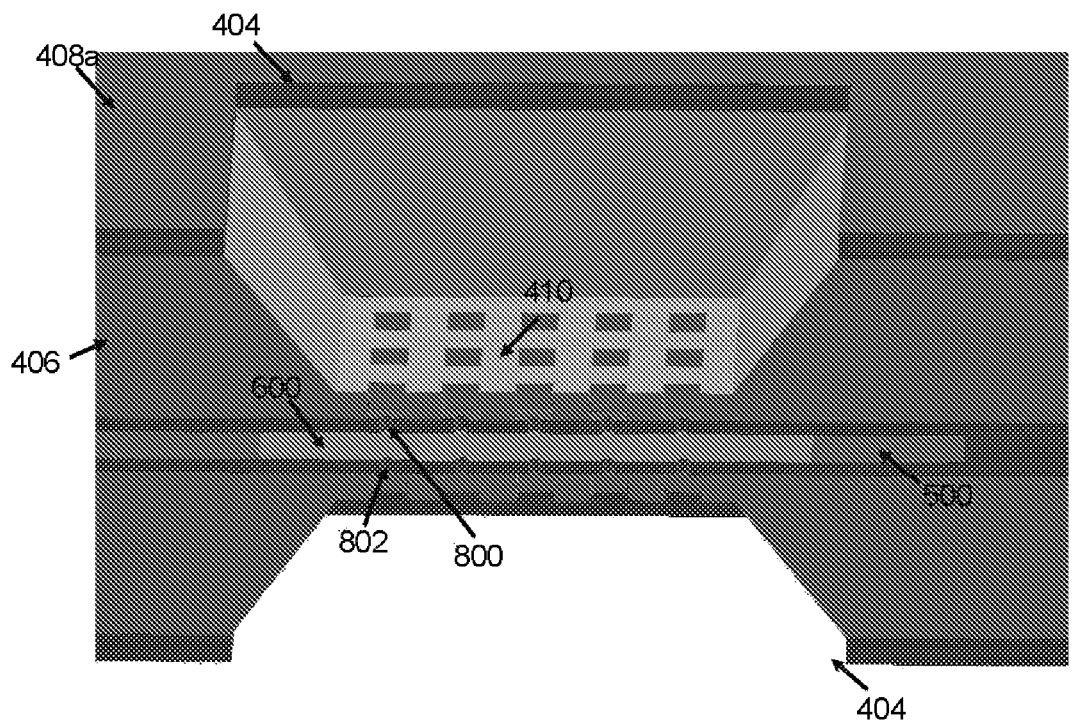
Figure 9:
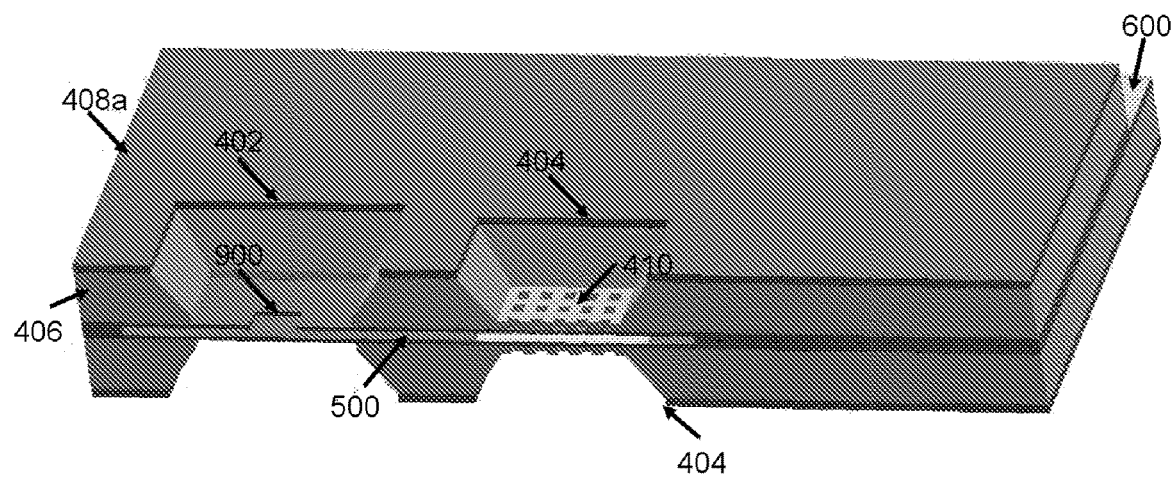

Once the chips 400 are fabricated, one embodiment of a NAIS chip 700 is fabricated by bonding two chips 400a, b as depicted in FIG. 7. These two chips 400a, b can be precisely aligned according to the supporting beams/grids 410. The electron injection apertures 800 and ion exit apertures 802 are milled by FIB resulting in well aligned sub-micron size apertures 800, 802, as shown in FIG. 8. FIG. 9 illustrates that the gas is fed through window 900 and maintains a reasonable pressure inside the ionization chamber 500 due to the small apertures 800, 802 (compare FIG. 8) of the electron injection window and ion exit window, respectively.

Figure 10:
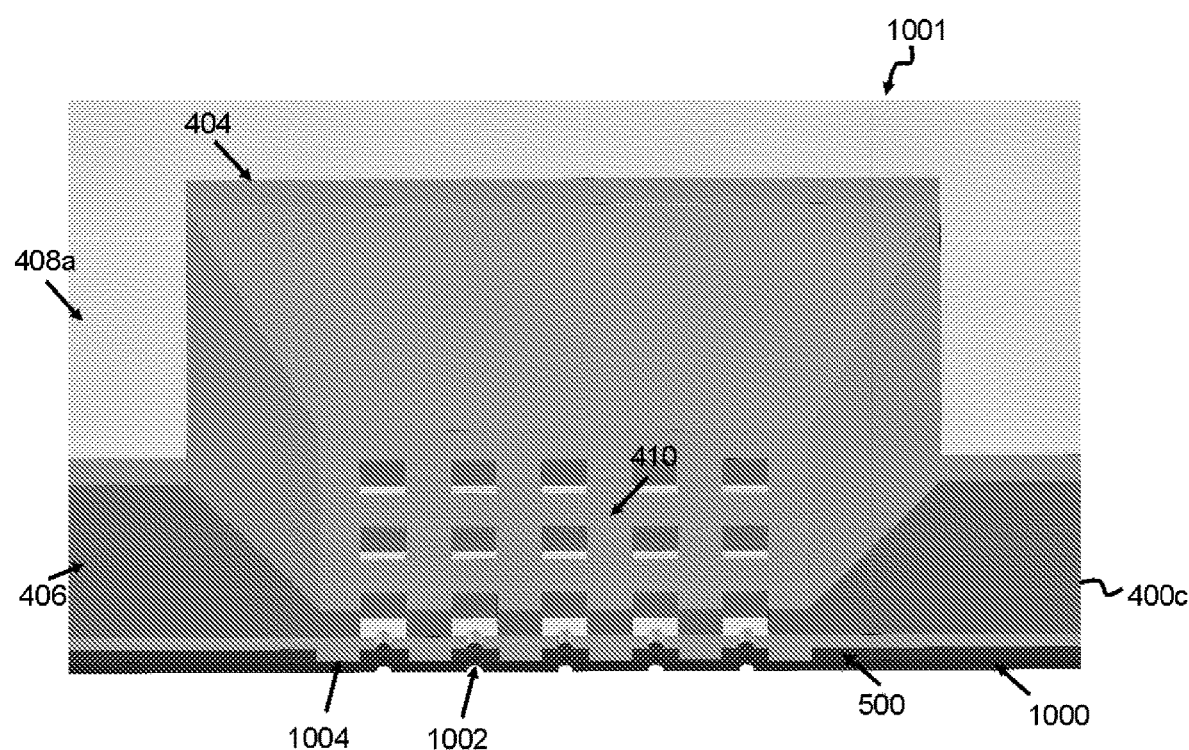
Figure 10:
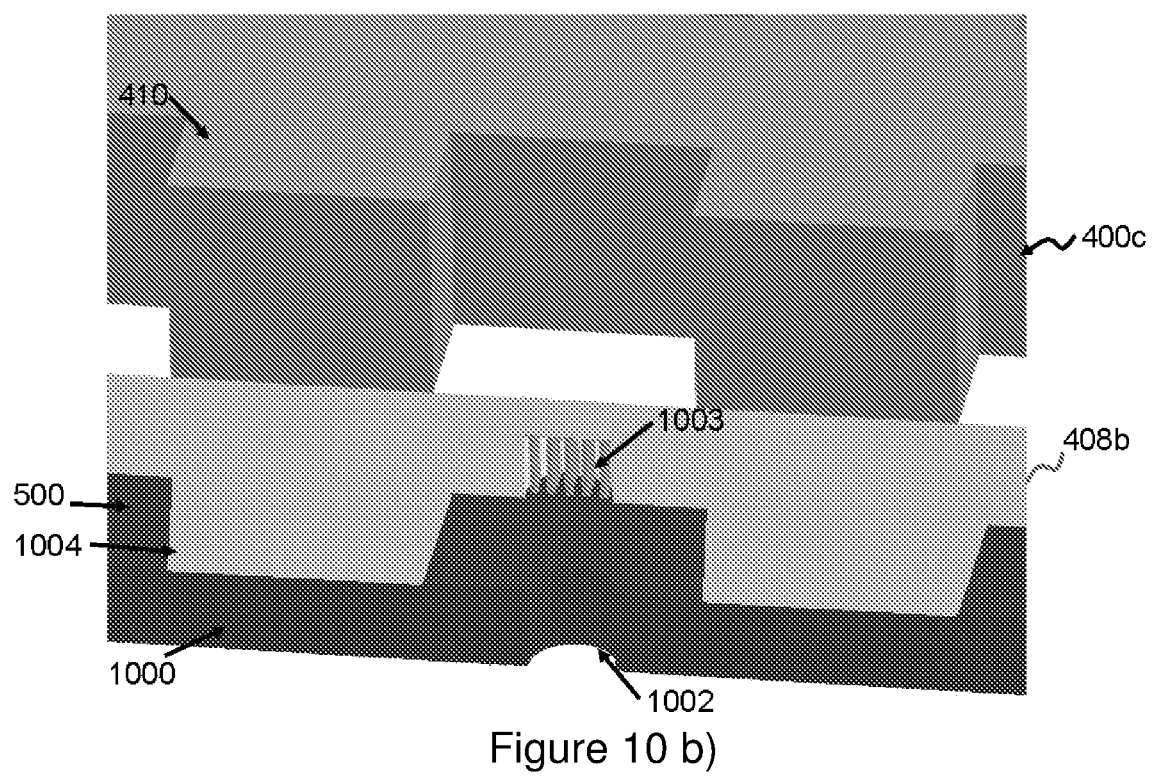
Figure 10:
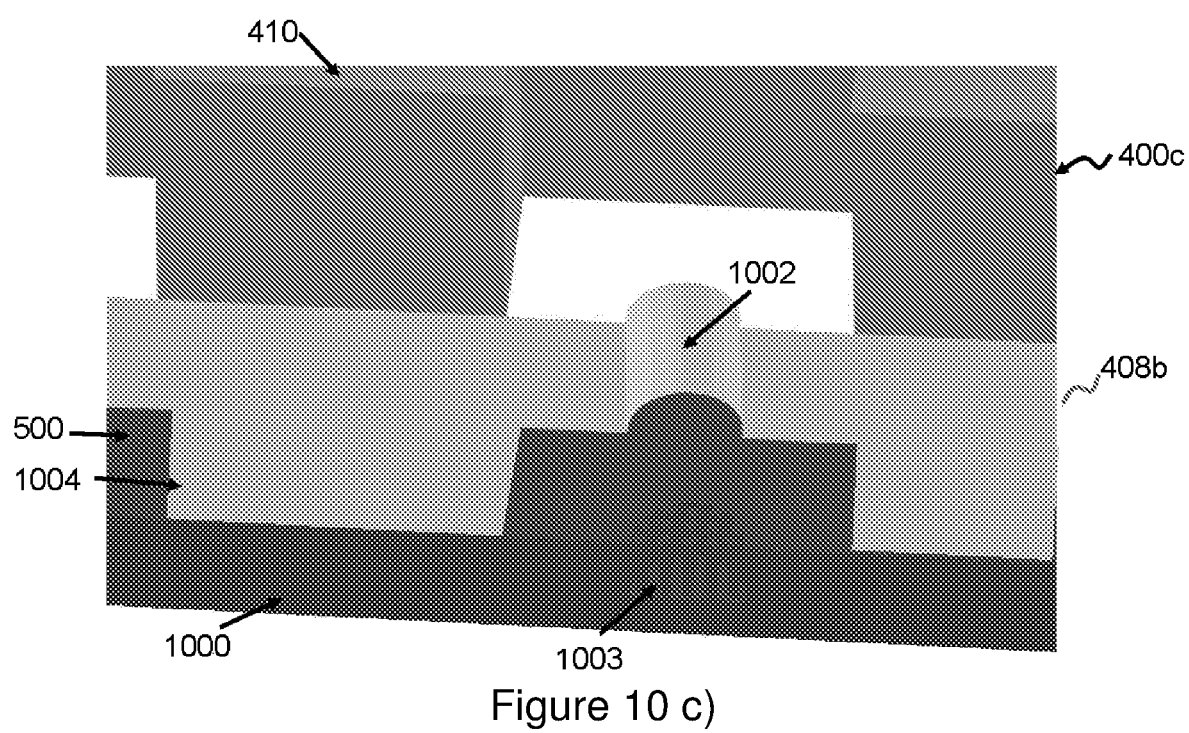
Figure 10:
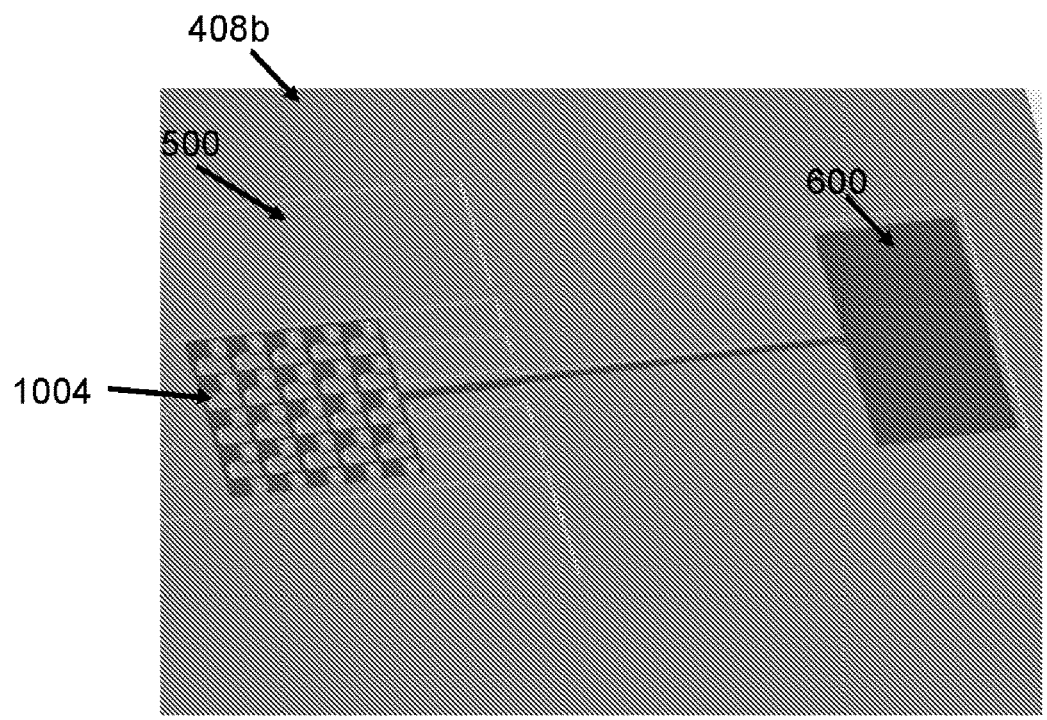

Another embodiment of NAIS chip 1001 is illustrated in FIG. 10 a), comprising of one chip 400c and graphite 1000 with ion exit apertures 1002. The ionization chamber is formed inside chip 400c with a port made of silicon nitride membrane. The rigidity of graphite 1000 film of approximately or exactly 10-100 nm thickness is preferably strong enough to hold about or exactly 1 bar pressure with small deformation. To reduce the deformation of the graphite 1000 film in the electron inlet/ion outlet region, silicon nitride pillars 1004 are formed on the back side of the wafer 406 as one integral layer etched down into the $Si_3N_4$ 408b as shown in FIG. 10 d) or patterned in HSQ. Advantageously, the graphite 1000 film also serves as an electrode in the example embodiment. The graphite 1000 film is transferred from a substrate (not shown) that has pre-deposited graphite on it, according to an example embodiment. The electron-injection window apertures 800 and the ion exit apertures 1002 of the double-aperture are milled by FIB in an example embodiment.

A different embodiment of the NAIS chip 1005, which uses a different configuration to create the electrons, which in turn are used for ionizing the gas in the ionization chamber 500, is shown in FIG. 10 b), comprising one chip 400c, graphite 1000 film and an array of efficient secondary electron emitters 1003 disposed within the $Si_3N_4$ 408b. Thus, a sealed continuous layer (i.e. $Si_3N_4$ 408b) is present at the electron entry opposite the ion exit apertures 1002 in this embodiment. A beam of primary electrons directed towards $Si_3N_4$ 408b will induce an avalanche of secondary electrons, from the array of secondary electron emitters 1003. In such embodiments, the current density of the electrons that are suitable to ionize the gas can advantageously be increased, thereby increasing the output ion current through the ion exit aperture 1002. In a different embodiment, the entrance of primary electrons and the exit of the ion beam are swapped, by placing the array of secondary electron emitters 1003 within graphite 1000 film and forming the ion exit apertures 1002 in the $Si_3N_4$ 408b layer, as shown in FIG. 10 c).

Figure 15:
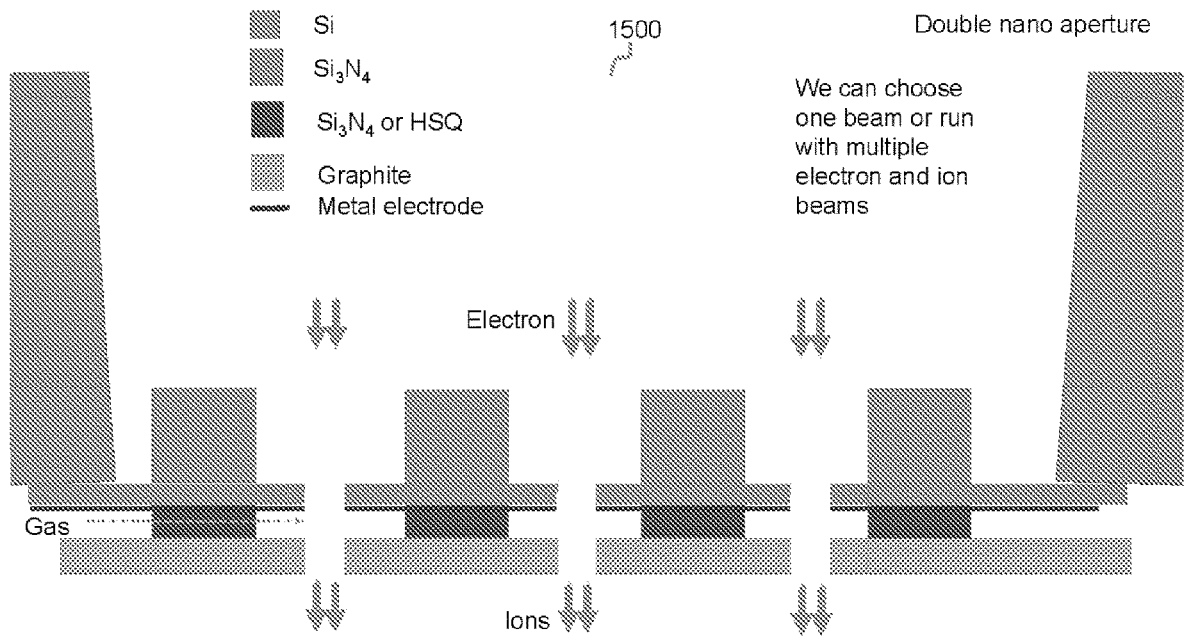
Figure 15:
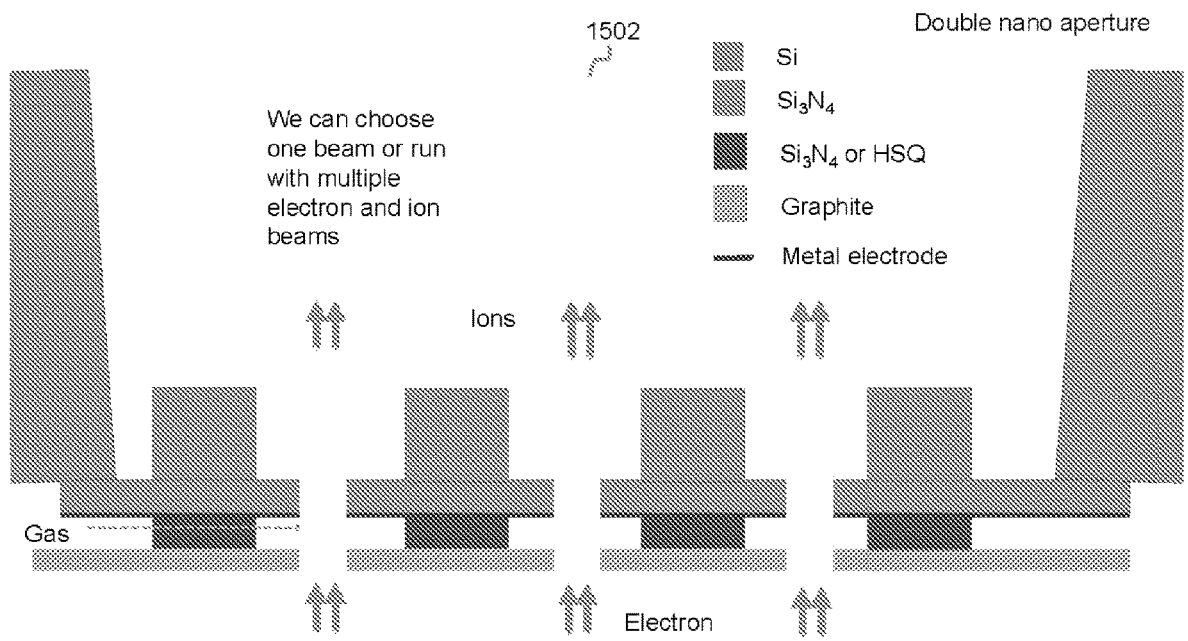
Figure 15:
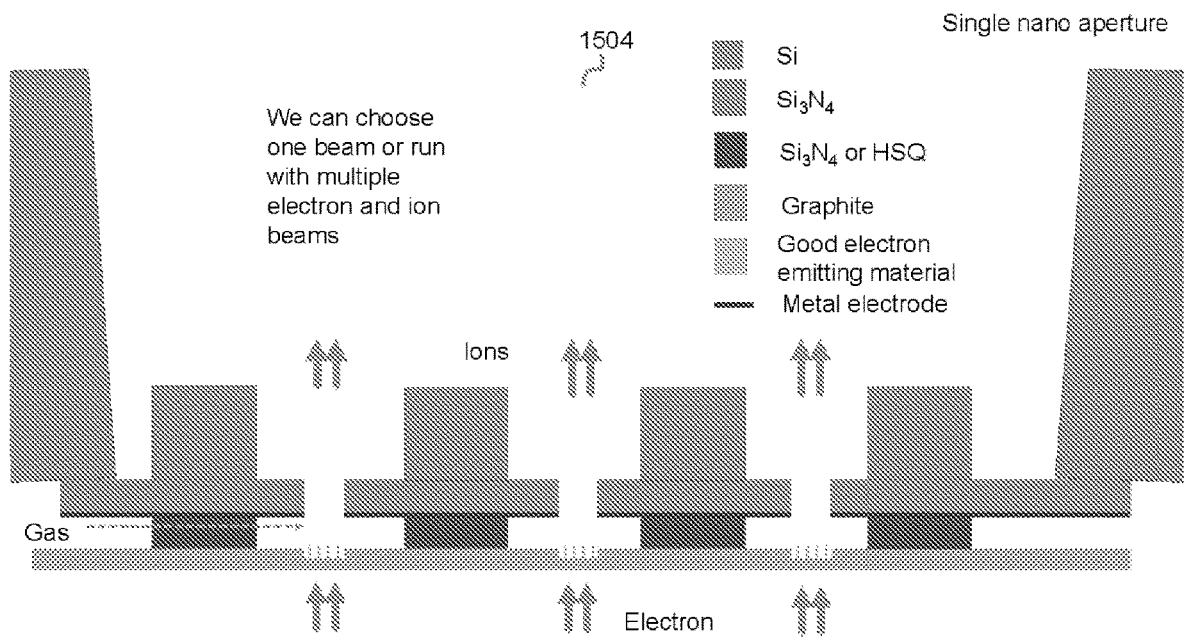
Figure 15:
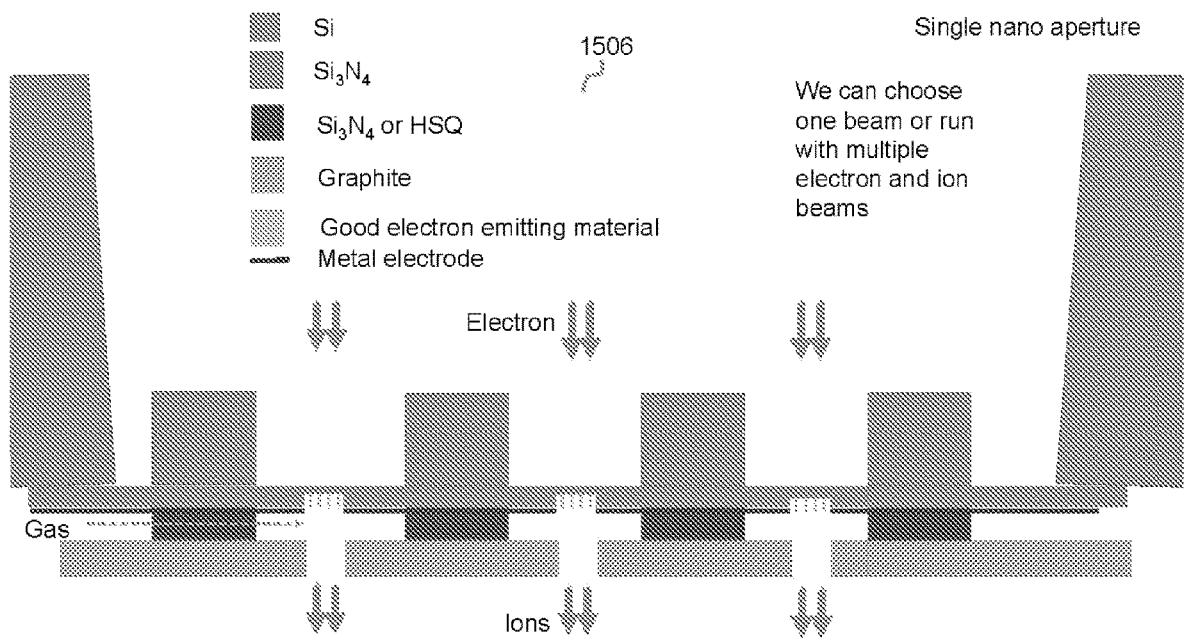

FIG. 15 a) shows a schematic drawing of another embodiment of a NAIS chip 1500 similar to the embodiment described above with reference to FIG. 10 a). FIG. 15 b) shows a schematic drawing of another embodiment of a NAIS chip 1502, being a modification of the embodiment of FIG. 10 a), namely with the electron entry and ion exit swapped. FIG. 15 c) shows a schematic drawing of another embodiment of a NAIS chip 1504 similar to the embodiment described above with reference to FIG. 10 c). FIG. 15 d) shows a schematic drawing of another embodiment of a NAIS chip 1506 similar the embodiment described above with reference to FIG. 10 b).

Figure 11:
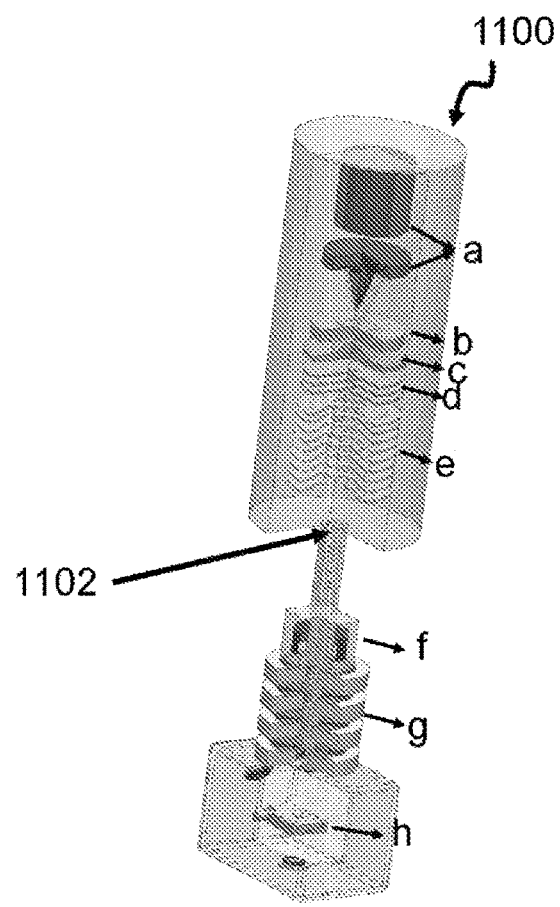

Application to Provide a c-PBW System with NAIS, According to an Example Embodiment Layout of a c-PBW System According to an Example Embodiment In accordance with an example embodiment, a c-PBW system that employs a high brightness NAIS chip according to an example embodiment for sub-10 nm lithography can be provided. A NAIS chip "b" for a proton beam with $10^6$ A/($m^2$srV) reduced brightness, 500 pA current, and 60 nm virtual source size is adopted according to a non-limiting example embodiment to evaluate the c-PBW system performance. The layout of the c-PBW system 1100 according to an example embodiment is shown in FIG. 11. Protons are generated by electron-gas collisions (electrons provided by electron injector "a") in the NAIS chip "b", and extracted using an extractor "c" with a tunable extraction voltage in the range of approximately or exactly −5 kV to −10 kV. Subsequently, a condenser lens "d" is used to shape the beam. The converged beam is then passed through an acceleration column or tube "e", where it gains a final energy of approximately or exactly 200 keV. A collimator aperture 1102 is used to prevent further transmission of high angular scattered ions, while mostly allowing less divergent ions to enter into the focusing lenses "g". An electrostatic scanner "f" is used, before the focusing lenses "g", to scan the beam after it is collimated. Three or four electromagnetic quadrupole lenses are employed in example embodiments to focus the beam into the end-station with sub-10 nm resolution. Considering a 2 µm inaccuracy in sample positioning (at image plane "h"), with a preset upper limit of the beam half angle α to 0.25 mrad, can advantageously ensure that the beam broadening is not more than 1 nm. The reduced brightness is given as $$B_r = \frac{I_P}{A_0 \Omega V} \approx \frac{I_P}{\frac{\pi}{4} d_P^2 \pi \alpha^2 V(2)} \qquad (2)$$

where $I_P$ (>0.2 pA) is the proton beam current, $A_0$ is the beam area, $d_P$ (<10 nm) is the beam diameter at the focal plane, Ω is the solid angle, α (<0.25 mrad) is the beam half-angle divergence, and V (200 kV) is the beam terminal voltage at the image plane. It is noted that with off the shelf position sensors inaccuracy in positioning the sample within the image plane can be adjusted to considering a 0.1 micron inaccuracy. This will lead to higher $I_P$ available for writing in preferred embodiments. With the limitation explained above, an ion source with a reduced brightness of more than $5 \times 10^4$ A/(m²srV) can achieve fast writing speed using the c-PBW system according to an example embodiment, with the NAIS chip "b" according to example embodiments as the ion source.

Figure 12:
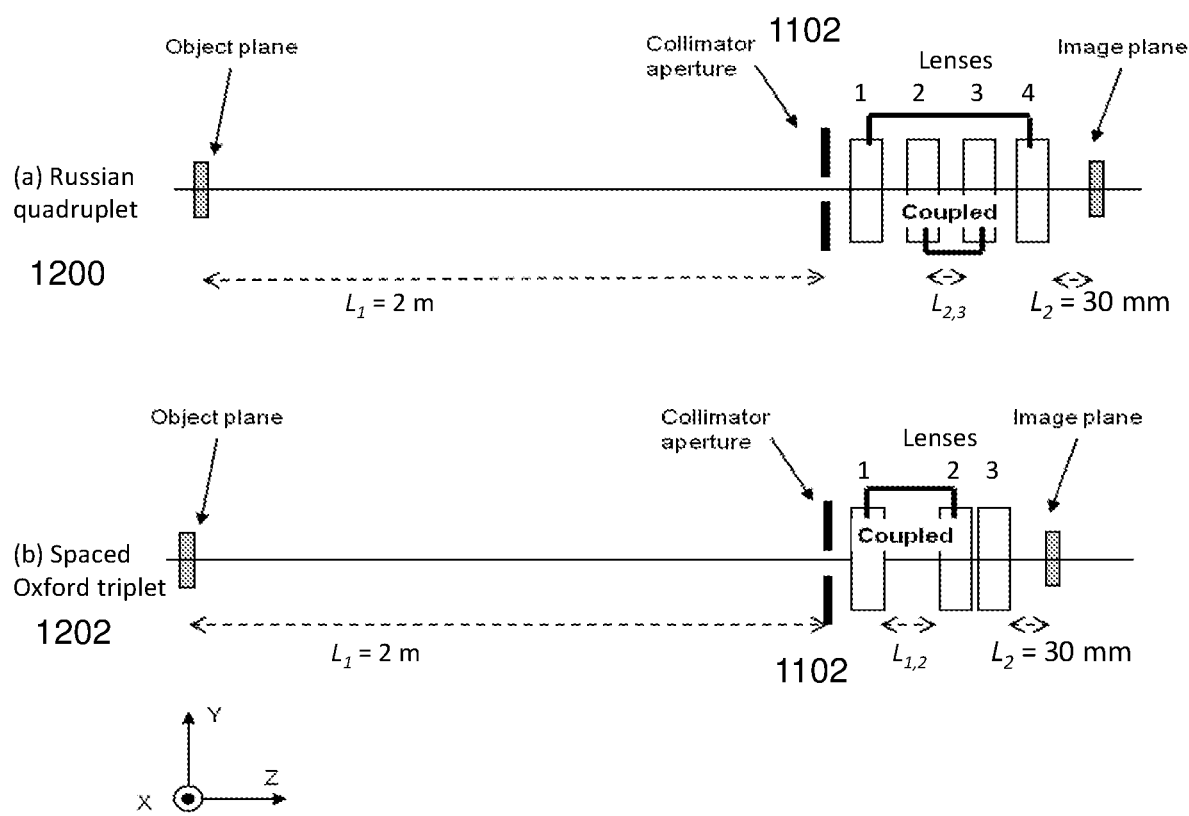

Lens Configuration and Probe Beam Evaluation of the c-PBW System According to an Example Embodiment In addition to providing for a high source reduced brightness, optimizing the focusing lens configuration has been recognized by the inventors to play a critical role in determining the capability to reach sub-10 nm proton beam resolution. Particle Beam Optics Laboratory 3.0 (PBO Lab) [38] is used to study the focusing capability of different lens configurations. The two commonly used lens configurations: the low excitation Russian quadruplet [39] and the spaced Oxford triplet [40] configurations 1200, 1202 are shown in FIGS. 12a) and b), respectively. The Russian quadruplet configuration 1200 has the same demagnification in both X and Y, while the spaced Oxford triplet configuration 1202 has different demagnifications in X and Y. Four magnetic lenses 1 to 4 make up the Russian quadruplet configuration 1200, where the separation between all lenses is fixed at 25 mm with the exception of lens 2 and 3 ($L_{2,3}$). $L_{2,3}$ is varied to evaluate the focusing performance of this configuration 1200. For the spaced Oxford triplet configuration 1202, three magnetic lenses 1 to 3 were used with a fixed separation of 25 mm between lens 2 and 3. The distance between lens 1 and 2 ($L_{1,2}$) is varied to investigate the focusing performance. In the c-PBW system according to an example embodiment, protons are extracted and accelerated to approximately or exactly 200 keV to reach the object plane. In the simulations, the object beam size ($d_v$) is considered to be the same as the virtual source size for simplicity. The distance between object plane and collimator aperture is set to be 2 μm. The working distance $L_2$ is fixed at 30 mm for both lens configurations 1200, 1202. A 200 keV proton beam is considered to have 2 eV beam energy spread, caused by the combined effect of the NAIS source energy spread (<1 eV) and <10 ppm acceleration power instability (<2 V for 200 kV). The instability of the magnetic field from the focus lens is 1 ppm.

A systematic approximation by root-power-sum algorithm for full width 90% (FW90, the width including 90% of proton beam current) proton beam diameter $d_p$ at image plane is described as [41], $$d_P = \{[d_I^{1.3} + (d_A^4 + d_C^4)^{1.3/4}]^{2/1.3} + d_S^2\}^{1/2} \quad (3)$$

where $d_I$ is demagnified virtual source size, and is given by $$d_I = \frac{d_v}{Dem} = \frac{2}{\pi}\sqrt{\frac{I_p}{B_r V}}\frac{1}{\alpha} \quad (4)$$

(where $d_v$ is the proton virtual source diameter, Dem is the demagnification of the focusing lens), $d_A$, $d_S$, and $d_C$ are the contributions from diffraction aberration, spherical aberration, and chromatic aberration, respectively. The contribution from the diffraction aberration is negligible, because the de Broglie wavelength of 200 keV proton is small (~6×10⁻¹⁴ μm). The contribution from spherical and chromatic aberrations are, $$d_S = 0.18 C_S \alpha_e^3 \quad (5)$$

$$d_C = 0.6 C_C \frac{\delta U}{V} \alpha_e \quad (6)$$

$\alpha_e$ is the proton beam half angle before entering the focusing lens, $C_s$ and $C_c$ are the spherical and chromatic aberrations, and $\delta U$ is the beam energy spread.

PBO Lab calculates the lens demagnification (Dem), chromatic ($C_e$), and spherical ($C_s$) aberrations. These parameters are expressed in two orthogonal directions (X and Y) for an astigmatic lens system. The characteristic values obtained from PBO Lab for Russian quadruplet configuration 1200 are summarized in Table 1. The coulomb effect is neglected here, and will be discussed in detail below.

TABLE 1

Parameters obtained from PBO Lab with the Russian quadruplet configuration at $L_{2,3}$ = 25 mm.

| | | |
|---|---|---|
| Proton beam energy | | 200 keV |
| Object plane to lens distance | | 2 m |
| Working distance | | 30 mm |
| Demagnification, Dem | 1/<x\|x) | 10.5 |
| | 1/(y\|y) | 10.5 |
| Chromatic aberration, $C_C$ | (x\|x'd) | 2872 μm/mrad |
| | (y\|y'd) | 5776 μm/mrad |
| Spherical aberration, $C_s$ | (x\|x'³) | −1.414 μm/mrad³ |
| | (x\|x'y'²) | −8.081 μm/mrad³ |
| | (y\|y') | −8.689 μm/mrad³ |
| | (y\|x'²y') | −8.081 μm/mrad³ |

Figure 13:
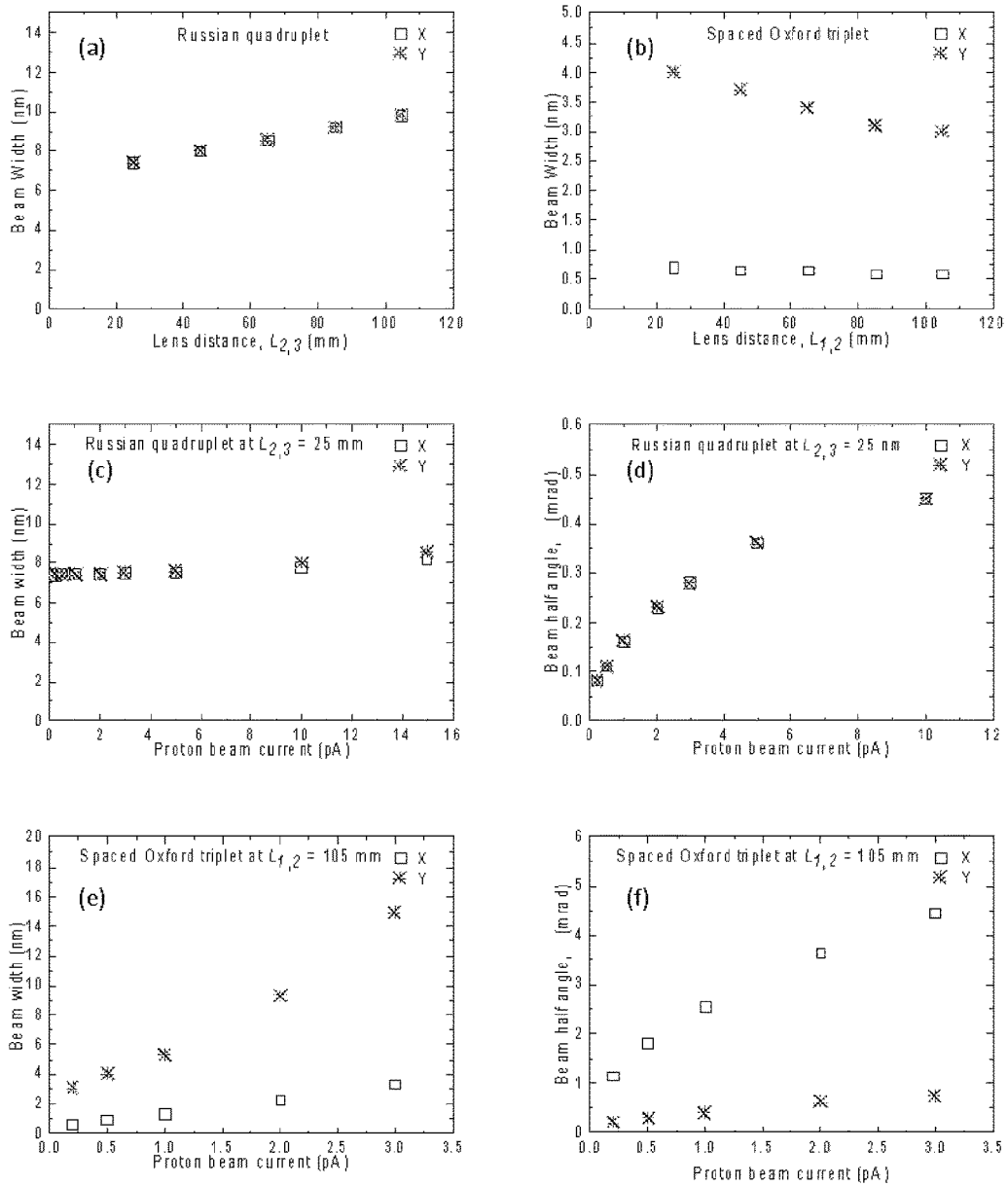

The final probe beam FW90 width at the image plane is shown in FIGS. 13a and b, as a function of $L_{2,3}$ and $L_{1,2}$, respectively. The most ideal lens distances for obtaining sub-10 nm beam spot sizes in Russian quadruplet and spaced Oxford triplet are $L_{2,3}$=25 mm and $L_{1,2}$=105 mm, respectively. With the preferred lens spacing for both configurations 1200, 1202, beam widths and divergences are examined according to different beam currents, as shown in FIGS. 13c-f. From FIG. 13c, one can see that the beam spot size remains sub-10 nm up to 15 pA. The different beam currents are obtained by changing the collimator aperture 1102 (compare FIG. 11), resulting in the change of beam half angle α. From FIG. 13d, it is clear that in order not to exceed the preset upper limit of beam half angle α (0.25 mrad), the beam current preferably does not exceed 2 pA for the Russian quadruplet lens configuration 1200.

Since the spaced Oxford triplet configuration 1202 has different demagnification in X and Y directions, there are two different preset upper limits for the beam half angle, $\alpha_x$ and $\alpha_y$, respectively. From FIG. 13f, one can have a beam current of 0.5 pA while maintaining $\alpha_y$ well below 0.25 mrad. Whereas due to the high demagnification in X direction, the upper limit of $\alpha_x$ can be increased up to 2 mrad (still maintaining a sub-10 nm focus in X, see FIG. 13e), while yielding a beam current of 0.5 pA. Table 2 summarizes the performance of these two lens configurations for the c-PBW system according to example embodiments, compared with current PBW and EBL systems. It shows a promising high-throughput for the c-PBW system according to example embodiments in the sub-10 nm regime that is faster than in EBL.

TABLE 2

Summary of 200 kV c-PBW with different lens configurations, to write a 10 nm × 1 mm line on PMMA, comparing with current PBW and EBL.

| Lithographic probe | c-PBW | Current PBW [22] | EBL [27, 34] |
|---|---|---|---|
| Beam virtual source diameter (nm) | 60 | 60 | ~2 mm |
| Lens configuration | Russian quadruplet | Spaced Oxford triplet | Spaced Oxford triplet |
| Less spacing (mm) | $L_{2,3} = 25$ | $L_{2,3} = 105$ | |
| Beam exit current from ion source (pA) | 500 | 500 | ~µA |
| Beam energy (keV) | 200 | 200 | 2000 | ~10's |
| Beam size at image plane (mm$^2$) | 7.5 × 7.5 | 0.9 × 4 | 9.3 × 32 | 5 × 5 |
| Beam current at image plane (pA) | 2 | 0.5 | 0.013 | 20 |
| Beam half angle at image plane (mrad) | 0.23 × 0.23 | 1.8 × 0.3 | 1.7 × 0.3 | |
| Bears reduced brightness (A/(m$^2$ srV)) | ~1 × 10$^6$ | ~1 × 10$^6$ | ~10 | ~10$^7$ |
| Writing time (second) | 0.5 | 2 | 100 | 5 |

Figure 14:
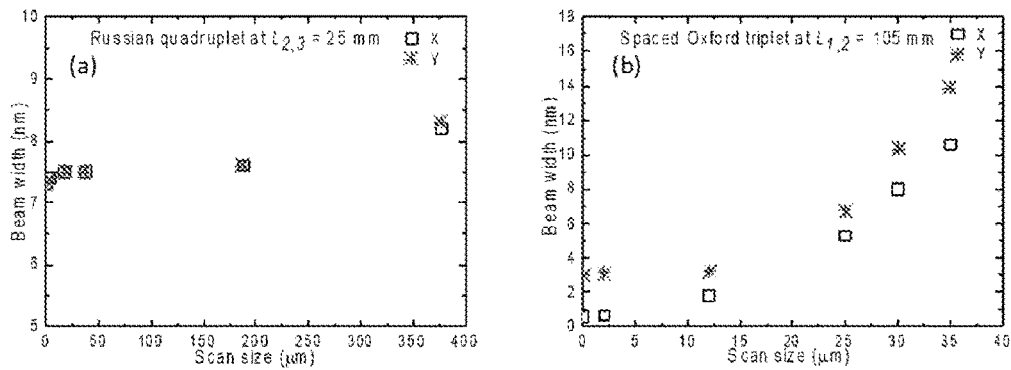

In lithography, the possibility of having a large scan size (~10's km) in the image plane is generally desirable. In the PBO simulation, a scanner is located 20 mm upstream from the first lens for both lens configurations 1200, 1202. As shown in FIGS. 14a) and b), the Russian quadruplet lens configuration according to an example embodiment can achieve sub-10 nm beam size with a 400×400 µm$^2$ scan size, while the spaced Oxford triplet lens configuration according to an example embodiment can only have a 30×30 µm$^2$ scan size, which is limited by the larger off-axis aberration (all simulations were performed with 0.2 pA).

Coulomb Effect of a c-PBW System According to Example Embodiments

An ion beam is not only affected by external fields but also influenced by the charged particles that introduce fields with neighboring ions, named as Coulomb effects. Generally, Coulomb effects consist of three different type of effects: a space charge effect, a Boersch effect, and a trajectory displacement effect [9]. Space charge effect is a deflection of a charged particle acted upon by the self-field generated by the beam. Usually, for a round beam with uniform distribution, the space charge effect can be compensated by the external lens due to the linear force in the transverse plane, and therefore neglected. Boersch effect and trajectory displacement effect are stochastic effects which are introduced by pair-wise interactions between charged particles. Trajectory displacement creates more spread towards the trans-verse energy of the beam, which in turn degrades the beam brightness. Meanwhile, the longitudinal beam energy gets broadened towards the thermodynamic equilibrium with the change of transverse energy, and this causes the total beam energy spread known as Boersch effect. These stochastic effects cannot be compensated by adjusting external focus fields. In most scenarios, at the high current density region, which is normally located at the source part [11], stochastic Coulomb effects can be important. To surmount the Coulomb effect in the source region, a stronger electric field is applied in order to reduce the interaction time. This will generally lead to a larger energy spread. However, in the NAIS chip setup according to example embodiments, a strong field is generated across a sub-micron spacer using a small bias potential difference (~1 V). This NAIS chip geometry advantageously limits the energy spread to less than 1 eV. Considering a typical ionization chamber designed for a Schottky electron injector, the electric field inside the chamber is approximately or exactly 107 V/m. This electric field preferably ensures that all the ions generated in the ionization chamber are guided towards the extraction plane. In this scenario the time taken by $H^+$ and $H_2^+$ to escape from the source is less than 100 ps. With such a flight time, there is only one ion expected to reside in the ionization chamber at a given point of time (this assumption is valid for ion currents up to ~2 nA [11]), and therefore the Coulomb interactions can advantageously be neglected inside the ion source according to example embodiments.

While the design considerations of a c-PBW systems according to the above described example embodiments are a conservative estimate, they already suggest a competitive writing speed coupled with minimal proximity effect.

In one embodiment, an ionization chamber chip for a nano-aperture ion source is provided, the ionization chamber chip comprising a first substrate comprising a first depression formed in a back surface thereof; a backing element attached at the back surface of the first substrate such that a chamber is formed comprising at least the first depression; a gas inlet formed in the first substrate in fluid communication with the chamber; and a first aperture structure formed in the first substrate in fluid communication with the chamber.

The ionization chamber can further comprise an electrode layer formed on the back surface of the first substrate, the electrode layer extending into the first depression.

The first aperture structure may comprise an array of beams/grids formed in a bulk material of the first substrate and an aligned array of aperture holes formed in a material layer forming the back surface of the first substrate.

The backing element may comprise a sheet.

The ionization chamber may comprise pillars formed on the back surface of the first substrate configured to reduce deformation of the sheet in the region adjacent the first aperture structure. The pillars may be formed as one integral layer etched down into the back surface of the first substrate. The pillars may be formed as one integral layer patterned in a high-resolution resist.

The backing element may comprise an array of aperture holes formed therein and aligned with the aperture holes formed in the material layer.

The ionization chamber may comprise an array of secondary electron emitters disposed in the first substrate or in the backing element.

The backing element may comprise a second substrate comprising a second depression formed in a back surface thereof, wherein the first and second substrates may be attached to each other at the respective back surfaces such that the chamber comprises the adjoining first and second depressions, and wherein the second aperture structure may comprise an array of beams/grids formed in a bulk material of the second substrate and an aligned array of aperture holes formed in a material layer forming the back surface of the second substrate.

The backing element may comprise a second substrate comprising a second depression formed in a back surface thereof; wherein the first and second substrates may be attached to each other at the respective back surfaces such that a chamber is formed comprising the adjoining first and second depressions; and wherein the first and second aperture structures may be formed a double aperture structure extending through respective thicknesses of the first and second substrates in fluid communication with the chamber.

The ionization chamber may further comprise a first electrode layer formed on a front surface of the first substrate opposite to the back surface; and a second electrode layer formed on a front surface of the second substrate opposite to the back surface. The first electrode layer may extend at least partially along a wall of the gas inlet and a wall of the double aperture and wherein the second electrode layer extends at least partially along the wall of the double aperture.

The gas inlet may comprise an inlet aperture extending through the thickness of the first substrate.

The second substrate may comprise a filled depression at a corresponding lateral position to the inlet aperture, relative to the attached back surfaces.

In one embodiment, a nano-aperture ion source is provided comprising the ionization chamber chip of the preceding embodiment.

In one embodiment, a proton beam writing system is provided comprising the nano-aperture ion source of the preceding embodiment.

Figure 16:
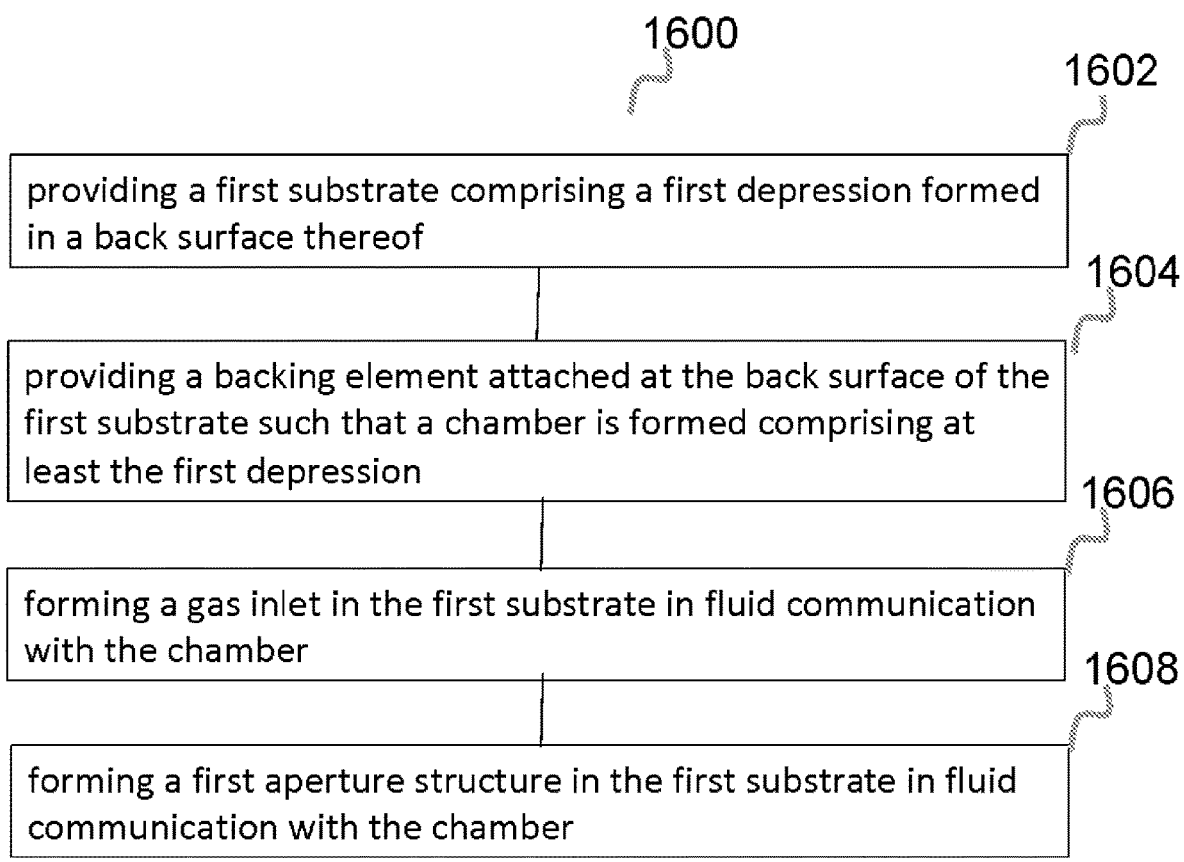

FIG. 16 shows a flowchart 1600 illustrating a method of fabricating an ionization chamber chip for a nano-aperture ion source, according to an example embodiment. At step 1602, a first substrate comprising a first depression formed in a back surface thereof is provided. At step 1604, a backing element attached at the back surface of the first substrate such that a chamber is formed comprising at least the first depression is provided. At step 1606, a gas inlet is formed in the first substrate in fluid communication with the chamber. At step 1608, a first aperture structure is formed in the first substrate in fluid communication with the chamber.

The method may further comprise forming an electrode layer on the back surface of the first substrate, the electrode layer extending into the first depression.

The first aperture structure may comprise an array of beams/grids formed in a bulk material of the first substrate and an aligned array of aperture holes formed in a material layer forming the back surface of the first substrate.

The backing element may comprise a sheet.

The method may comprise forming pillars on the back surface of the first substrate configured to reduce deformation of the sheet in the region adjacent the first aperture structure. The pillars may be formed as one integral layer etched down into the back surface of the first substrate. The pillars may be formed as one integral layer etched patterned in a high-resolution resist.

The backing element may comprise an array of aperture holes formed therein and aligned with the aperture holes formed in the material layer.

The method may comprise disposing an array of secondary electron emitters in the first substrate or in the backing element.

The backing element may comprise a second substrate comprising a second depression formed in a back surface thereof, wherein the first and second substrates may be attached to each other at the respective back surfaces such that the chamber comprises the adjoining first and second depressions, and wherein forming the second aperture structure may comprise forming an array of beams/grids in a bulk material of the second substrate and forming an aligned array of aperture holes in a material layer forming the back surface of the second substrate.

The backing element may comprise a second substrate comprising a second depression formed in a back surface thereof; wherein the first and second substrates may be attached to each other at the respective back surfaces such that a chamber is formed comprising the adjoining first and second depressions; and the method may further comprise forming a double aperture comprising the first and second aperture structures, the double aperture extending through respective thicknesses of the first and second substrates in fluid communication with the chamber.

The method may further comprise forming a first electrode layer on a front surface of the first substrate opposite to the back surface; and forming a second electrode layer on a front surface of the second substrate opposite to the back surface. The first electrode layer may extend at least partially along a wall of the gas inlet and a wall of the double aperture and the second electrode layer may extend at least partially along the wall of the double aperture.

The gas inlet may comprise an inlet aperture extending through the thickness of the first substrate.

The method may comprise forming a filled depression in the second substrate at a corresponding lateral position to the inlet aperture, relative to the attached back surfaces.

The first and second substrates may be batch processed prior to being attached to each other at the respective back surfaces. The batch processing comprises simultaneously forming respective portions of the double aperture in the first and second substrates. The batch processing may comprise simultaneously forming a portion of the gas inlet and a corresponding depression in the first and second substrates, respectively. The batch processing may comprise simultaneously forming the first and second electrode layers on the front surfaces of the first and second substrates, respectively.

The above description of illustrated embodiments of the systems and methods is not intended to be exhaustive or to limit the systems and methods to the precise forms disclosed. While specific embodiments of, and examples for, the systems components and methods are described herein for illustrative purposes, various equivalent modifications are possible within the scope of the systems, components and methods, as those skilled in the relevant art will recognize. The teachings of the systems and methods provided herein can be applied to other processing systems and methods, not only for the systems and methods described above.

The elements and acts of the various embodiments described above can be combined to provide further embodiments. These and other changes can be made to the systems and methods in light of the above detailed description.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

REFERENCES

[1] J. A. van Kan, A. A. Bettiol, F. Watt, Proton beam writing of three-dimensional nano-structures in hydrogen silsesquioxane, Nano Lett. 6 (3) (2006) 579-582.
[2] F. Watt, M. B. Breese, A. A. Bettiol, J. A. vanKan, Proton beam writing, Mater. Today 10 (6) (2007) 20-29.
[3] J. A. Van Kan, A. A. Bettiol, F. Watt, Three-dimensional nanolithography using proton beam writing, Appl. Phys. Lett. 83 (8) (2003) 1629-1631.
[4] C. Udalagama, A. A. Bettiol, F. Watt, Stochastic spatial energy deposition profiles for MeV protons and keV electrons, Phys. Rev. B 80 (22) (2009) 224107.
[5] J. A. VanKan, P. Shao, K. Ansari, A. A. Bettiol, T. Osipowicz, F. Watt, Proton beam writing: a tool for high-aspect ratio mask production, Microsyst. Technol. 13 (5-6) (2007) 431-434.
[6] R. Szymanski, D. N. Jamieson, Ion source brightness and nuclear microprobe applications, Nucl. Instrum. Methods Phys. Res., Sect. B 130 (1) (1997) 80-85.
[7] J. A. Van Kan, P. Malar, A. B. De Vera, The second generation Singapore high resolution proton beam writing facility, Rev. Sci. Instrum. 83 (2) (2012) 02B902.
[8] M. Reiser, Theory and Design of Charged Particle Beams, John Wiley & Sons, 2008.
[9] J. Orloff, Handbook of Charged Particle Optics, CRC press, 2008.
[10] J. Orloff, High-resolution focused ion beams, Rev. Sci. Instrum. 64 (5) (1993) 1105-1130.
[11] J. Orloff, L. Swanson, M. Utlaut, High Resolution Focused Ion Beams: FIB and Its Applications: the Physics of Liquid Metal Ion Sources and Ion Optics and their Application to Focused Ion Beam Technology, Springer Science & Business Media, 2003.
[12] P. D. Prewett, G. L. R. Mair, Focused Ion Beams from Liquid Metal Ion Sources, Re-search Studies Press Ltd, 1991.
[13] R. Forbest, Understanding how the liquid-metal ion source works, Vacuum 48 (1) (1997) 85-97.
[14] G. Taylor, Disintegration of water drops in an electric field, Proc. R. Soc. Lond. A (1964) 383-397.
[15] M. Watts, Analytical model of positive resist development applied to line width control in optical lithography, J. Vac. Sci. Technol. B 3 (1) (1985) 434-440.
[16] C. Hagen, E. Fokkema, P. Kruit, Brightness measurements of a gallium liquid metal ion source, J. Vac. Sci. Technol. B 26 (6) (2008) 2091-2096.
[17] N. P. Economou, J. A. Notte, W. B. Thompson, The history and development of the helium ion microscope, Scanning 34 (2) (2012) 83-89.
[18] G. Hlawacek, V. Veligura, R. van Gastel, B. Poelsema, Helium ion microscopy, J. Vac. Sci. Technol. B 32 (2) (2014) 020801.
[19] B. '. Ward, J. A. Notte, N. Economou, Helium ion microscope: a new tool for nanoscale microscopy and metrology, J. Vac. Sci. Technol. B 24 (6) (2006) 2871-2874.
[20] F. Rahman, S. McVey, L. Farkas, J. A. Notte, S. Tan, R. H. Livengood, The prospects of a subnanometer focused neon ion beam, Scanning 34 (2) (2012) 129-134.
[21] R. Hill, J. Notte, B. Ward, The ALIS He ion source and its application to high resolution microscopy, Phys. Procedia 1 (1) (2008) 135-141.
[22] H.-S. Kuo, S. Hwang, T.-Y. Fu, Y.-H. Lu, C.-Y. Lin, T. T. Tsong, Gas field ion source from an Ir/W b11N single-atom tip, Appl. Phys. Lett. 92 (2008) 063106.
[23] N. G. Einspruch, S. S. Cohen, R. N. Singh, Beam Processing Technologies, Academic Press, 2014.
[24] J. J. McClelland, A. V. Steele, B. Knuffman, K. A. Twedt, A. Schwarzkopf, T. M. Wilson, Bright focused ion beam sources based on laser-cooled atoms, Appl. Phys. Rev. 3 (1) (2016) 011302.
[25] B. Knuffman, A. Steele, J. McClelland, Cold atomic beam ion source for focused ion beam applications, J. Appl. Phys. 114 (4) (2013) 044303.
[26] S. Van der Geer, M. Reijnders, M. de Loos, E. Vredenbregt, P. Mutsaers, O. Luiten, Simulated performance of an ultracold ion source, J. Appl. Phys. 102 (9) (2007) 094312.
[27] J. L. Hanssen, J. J. Mc Clelland, E. Dakin, M. Jacka, Laser-cooled atoms as a focused ion-beam source, Phys. Rev. A 74 (6) (2006) 063416.
[28] J. L. Hanssen, S. B. Hill, J. Orloff, J. J. McClelland, Magneto-optical-trap-based, high brightness ion source for use as a nanoscale probe, Nano Lett. 8 (9) (2008) 2844-2850.
[29] K. A. Twedt, L. Chen, J. J. Mc Clelland, Scanning ion microscopy with low energy lithium ions, Ultramicroscopy 142 (2014) 24-31.
[30] D. S. Jun, V. G. Kutchoukov, P. Kruit, Ion beams in SEM: an experiment towards a high brightness low energy spread electron impact gas ion source, J. Vac. Sci. Technol. B 29 (6) (2011) 06F603.
[31] X. Xu, N. Liu, P. S. Raman, S. Qureshi, R. Pang, A. Khursheed, J. A. van Kan, Design considerations for a compact proton beam writing system aiming for fast sub-10 nm direct write lithography, Nucl. Instrum. Methods Phys. Res., Sect. B (2016) http://dx.doi.org/10.1016/j.nimb.2016.12.031 (in press).
[32] N. Liu, X. Xu, R. Pang, P. S. Raman, A. Khursheed, J. A. van Kan, Brightness measurement of an electron impact gas ion source for proton beam writing applications, Rev. Sci. Instrum. 87 (2) (2016) 02A903.
[33] N. Liu, P. S. Raman, X. Xu, H. M. Tan, A. Khursheed, J. A. van Kan, Development of ion sources: towards high brightness for proton beam writing applications, Nucl. Instrum. Methods Phys. Res., Sect. B 348 (2015) 23-28.
[34] L. Reimer, Scanning Electron Microscopy: Physics of Image Formation and Micro-analysis, IOP Publishing, 2000.
[35] M. Breese, D. Jamieson, P. King, Materials Analysis with a Nuclear Microprobe, Wiley, New York, 1996.
[36] R. Rejoub, B. Lindsay, R. Stebbings, Determination of the absolute partial and total cross sections for electron-impact ionization of the rare gases, Phys. Rev. A 65 (4) (2002) 042713.
[37] D. W. Heddle, Electrostatic Lens Systems, CRC Press, 2000.
[38] AccelSoft Inc. Particle Beam Optics Laboratory 3.0 (PBO Lab). http://www.ghga.com/accelsoft/pbolab.html.
[39] F. Watt, G. W. Grime, Principles and Applications Of High-Energy Ion Microbeams, 1987.
[40] G. W. Grime, F. Watt, Beam Optics of Quadrupole Probe-Forming Systems, Hilger, 1984.
[41] J. Barth, P. Kruit, Addition of different contributions to the charged particle probe size, Optik 101 (1996) 101-109.

We claim:

1. An ionization chamber chip for a nano-aperture ion source, the ionization chamber chip comprising:
a first substrate including a first depression formed in a back surface of the first substrate;
a backing element attached at the back surface of the first substrate such that a chamber is formed including at least the first depression;
a gas inlet formed in the first substrate in fluid communication with the chamber;
a first aperture structure formed in the first substrate in fluid communication with the chamber; and
an electrode layer formed on the back surface of the first substrate, the electrode layer extending into the first depression.

2. The ionization chamber chip of claim 1, wherein the first aperture structure includes an array of beams formed in a bulk material of the first substrate and an aligned array of aperture holes formed in a material layer forming the back surface of the first substrate.

3. The ionization chamber chip of claim 2, wherein the backing element includes an array of aperture holes formed in the backing element and aligned with the aligned array of aperture holes formed in the material layer.

4. The ionization chamber chip of claim 1, further comprising:
pillars formed on the back surface of the first substrate, the pillars configured to reduce deformation of a sheet of the backing element in a region adjacent the first aperture structure, wherein the pillars are formed as at least one selected from a group consisting of one integral layer etched down into the back surface of the first substrate and one integral layer patterned in a high-resolution resist.

5. The ionization chamber chip of claim 1, further comprising:
an array of secondary electron emitters disposed in at least one selected from a group consisting of the first substrate and the backing element.

6. The ionization chamber chip of claim 1, wherein the backing element includes a second substrate including a second depression formed in a back surface of the second substrate, wherein the back surface of the first substrate and the back surface of the second substrate are attached such that the chamber includes the adjoining first depression and the second depression.

7. The ionization chamber chip of claim 6, wherein the first aperture structure and a second aperture structure formed in the second substrate form a double aperture structure extending through respective thicknesses of the first substrate and the second substrate, the double aperture structure in fluid communication with the chamber.

8. The ionization chamber chip of claim 6, further comprising:
a first electrode layer formed on a front surface of the first substrate opposite to the back surface of the first substrate; and
a second electrode layer formed on a front surface of the second substrate opposite to the back surface of the second substrate.

9. The ionization chamber chip of claim 8, wherein the first electrode layer extends at least partially along a wall of the gas inlet and a wall of a double aperture structure and wherein the second electrode layer extends at least partially along the wall of the double aperture structure.

10. The ionization chamber chip of claim 9, wherein the gas inlet includes an inlet aperture extending through a thickness of the first substrate and wherein the second substrate includes a filled depression at a corresponding lateral position to the inlet aperture relative to the attached back surfaces.

11. A nano-aperture ion source, the nano-aperture ion source comprising the ionization chamber chip of claim 1.

12. A method of fabricating an ionization chamber chip for a nano-aperture ion source, the method comprising:
providing a first substrate including a first depression formed in a back surface of the first substrate;
providing a backing element attached at the back surface of the first substrate such that a chamber is formed including at least the first depression;
forming a gas inlet in the first substrate in fluid communication with the chamber; and
forming a first aperture structure in the first substrate in fluid communication with the chamber;
wherein the backing element includes a second substrate including a second depression formed in a back surface of the second substrate, wherein the back surface of the first substrate and the back surface of the second substrate are attached such that the chamber includes the adjoining first depression and the second depression.

13. The method as claimed in claim 12, further comprising:
forming a first electrode layer on a front surface of the first substrate opposite to the back surface; and
forming a second electrode layer on a front surface of the second substrate opposite to the back surface.

14. The method as claimed in claim 12, wherein the first substrate and the second substrate are batch processed prior to being attached to each other.

15. The method as claimed in claim 14, wherein the batch processing includes simultaneously forming respective portions of a double aperture in the first substrate and the second substrate, the double aperture extending through respective thicknesses of the first substrate and the second substrate and in fluid communication with the chamber.

16. The method as claimed in claim 14, wherein the batch processing includes simultaneously forming a portion of the gas inlet and a corresponding depression in the first substrate and the second substrate, respectively.

17. The method as claimed in claim 14, wherein the batch processing includes simultaneously forming a first electrode layer on a front surface of the first substrate opposite to the back surface of the first substrate and a second electrode layer on a front surface of the second substrate opposite to the back surface of the second substrate.

18. An ionization chamber chip for a nano-aperture ion source, the ionization chamber chip comprising:
a first substrate including a first depression formed in a back surface of the first substrate;
a backing element attached at the back surface of the first substrate such that a chamber is formed including at least the first depression;
a gas inlet formed in the first substrate in fluid communication with the chamber; and
a first aperture structure formed in the first substrate in fluid communication with the chamber;
wherein the backing element includes a second substrate including a second depression formed in a back surface of the second substrate, wherein the back surface of the first substrate and the back surface of the second substrate are attached such that the chamber includes the adjoining first depression and the second depression.

19. The ionization chamber chip of claim 18, wherein a second aperture structure formed in the second substrate includes an array of beams formed in a bulk material of the second substrate and an aligned array of aperture holes formed in a material layer forming the back surface of the second substrate.

20. The ionization chamber chip of claim 18, further comprising:
- a first electrode layer formed on a front surface of the first substrate opposite to the back surface of the first substrate; and
- a second electrode layer formed on a front surface of the second substrate opposite to the back surface of the second substrate.

* * * * *